United States Patent
Yeong et al.

(10) Patent No.: US 12,125,922 B2
(45) Date of Patent: Oct. 22, 2024

(54) NANOSHEET FIELD-EFFECT TRANSISTOR DEVICE AND METHOD OF FORMING

(71) Applicant: Taiwan Semiconductor Manufacturing Co., Ltd., Hsinchu (TW)

(72) Inventors: Sai-Hooi Yeong, Zhubei (TW); Bo-Feng Young, Taipei (TW); Chien Ning Yao, Hsinchu (TW); Chi On Chui, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/357,491

(22) Filed: Jul. 24, 2023

(65) Prior Publication Data

US 2023/0369512 A1 Nov. 16, 2023

Related U.S. Application Data

(63) Continuation of application No. 17/574,844, filed on Jan. 13, 2022, now Pat. No. 11,791,421, which is a
(Continued)

(51) Int. Cl.
*H01L 29/786* (2006.01)
*H01L 29/08* (2006.01)
*H01L 29/423* (2006.01)
*H01L 29/66* (2006.01)
*H01L 29/78* (2006.01)

(52) U.S. Cl.
CPC .... *H01L 29/78696* (2013.01); *H01L 29/0847* (2013.01); *H01L 29/42392* (2013.01); *H01L 29/66545* (2013.01); *H01L 29/66795* (2013.01); *H01L 29/7851* (2013.01)

(58) Field of Classification Search
CPC .......... H01L 29/78696; H01L 29/0847; H01L 29/42392; H01L 29/66545; H01L 29/66795; H01L 29/7851; H01L 27/0886; H01L 29/0673; H01L 29/42376; H01L 21/823431; H01L 29/66439; H01L 29/6653; H01L 29/66553; H01L 29/165; H01L 29/6656; H01L 29/7848;
(Continued)

(56) References Cited

U.S. PATENT DOCUMENTS 10,651,291 B2   5/2020   Frougier et al.
11,227,956 B2   1/2022   Yeong et al.
(Continued)

FOREIGN PATENT DOCUMENTS

KR   20190024535 A   3/2019
TW   201912564 A   4/2019

*Primary Examiner* — Tong-Ho Kim
(74) *Attorney, Agent, or Firm* — Slater Matsil, LLP

(57) ABSTRACT

A semiconductor device includes: a fin protruding above a substrate; source/drain regions over the fin; nanosheets between the source/drain regions, where the nanosheets comprise a first semiconductor material; inner spacers between the nanosheets and at opposite ends of the nanosheets, where there is an air gap between each of the inner spacers and a respective source/drain region of the source/drain regions; and a gate structure over the fin and between the source/drain regions.

20 Claims, 16 Drawing Sheets

Related U.S. Application Data continuation of application No. 16/882,965, filed on May 26, 2020, now Pat. No. 11,227,956.

(60) Provisional application No. 62/955,154, filed on Dec. 30, 2019.

(58) Field of Classification Search
CPC .............. H01L 29/775; H01L 29/0649; H01L 29/0665; H01L 29/785; H01L 29/4983; B82Y 10/00
USPC ........................................................ 257/401
See application file for complete search history.

(56) References Cited

U.S. PATENT DOCUMENTS

| | | |
|---|---|---|
| 11,791,421 B2 * | 10/2023 | Yeong ............... H01L 29/78696 257/401 |
| 2018/0301564 A1 | 10/2018 | Kwon et al. |
| 2019/0067441 A1 | 2/2019 | Yang et al. |
| 2019/0305104 A1 | 10/2019 | Xie et al. |
| 2019/0393357 A1 | 12/2019 | Chen et al. |
| 2020/0357911 A1 | 11/2020 | Frougier et al. |
| 2020/0365692 A1 * | 11/2020 | Jung ..................... H01L 29/785 |
| 2021/0074548 A1 | 3/2021 | Lin et al. |

* cited by examiner

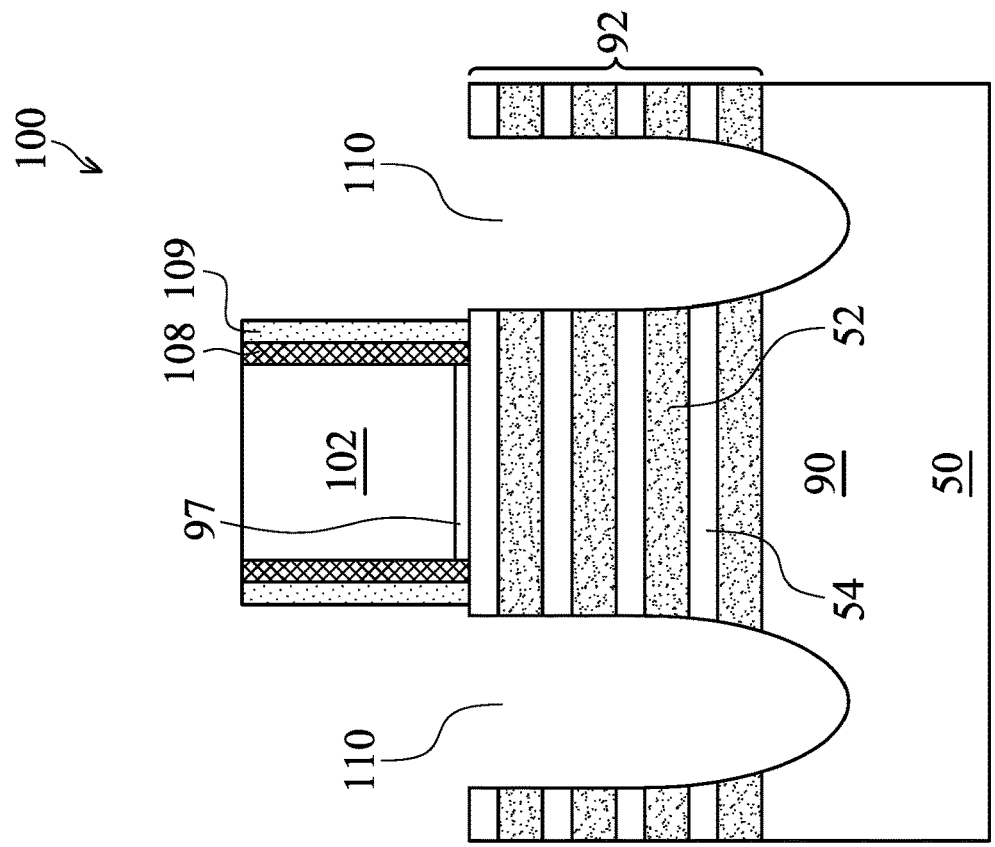
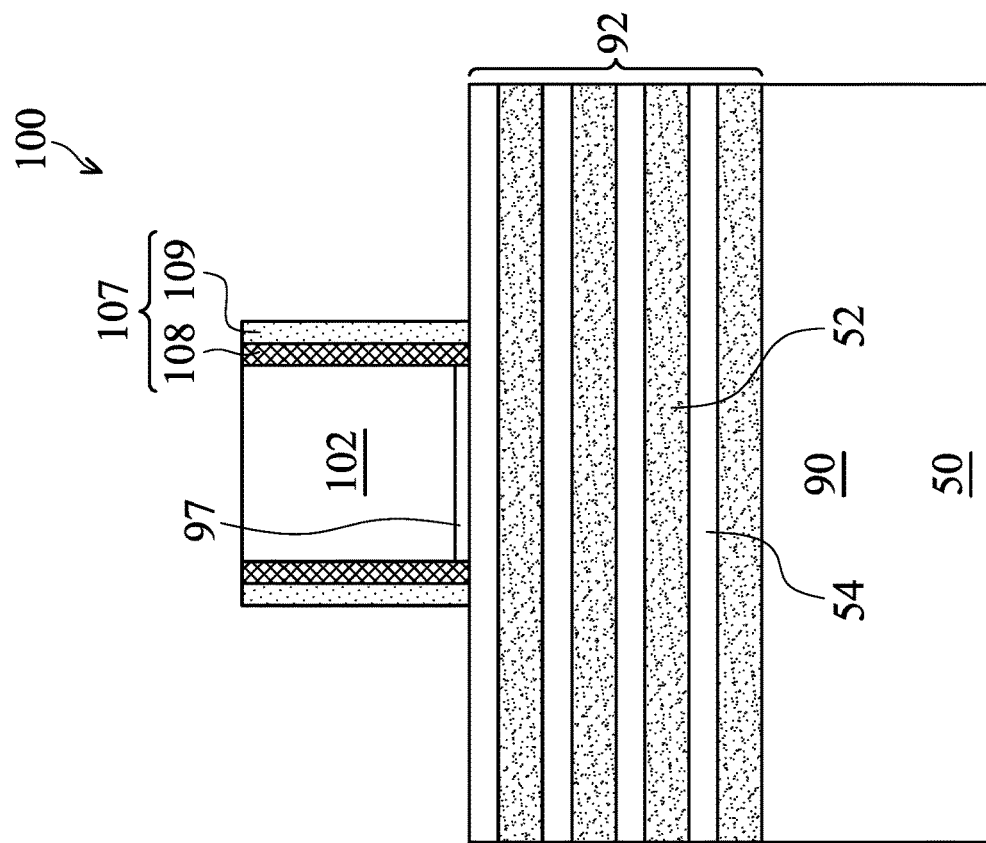
Figure 7
Figure 6

NANOSHEET FIELD-EFFECT TRANSISTOR DEVICE AND METHOD OF FORMING

PRIORITY CLAIM AND CROSS-REFERENCE

This application is a continuation of U.S. application Ser. No. 17/574,844, filed Jan. 13, 2022 and entitled "Nanosheet Field-Effect Transistor Device and Method of Forming," which is a continuation of U.S. patent application Ser. No. 16/882,965, filed on May 26, 2020 and entitled "Nanosheet Field-Effect Transistor Device and Method of Forming," (now U.S. Pat. No. 11,227,956, issued Jan. 18, 2022) which claims the benefit of U.S. Provisional Application No. 62/955,154, filed on Dec. 30, 2019 and entitled "Super Inner Spacer Process and Design for Gate-All-Around (GAA) Device," which applications are hereby incorporated herein by reference in their entireties.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3A, 3B, 4A, 4B, 5A, 5B, and 6-17 are cross-sectional views of a nanosheet field-effect transistor device at various stages of manufacturing, in accordance with an embodiment.

DETAILED DESCRIPTION

Figure 1:
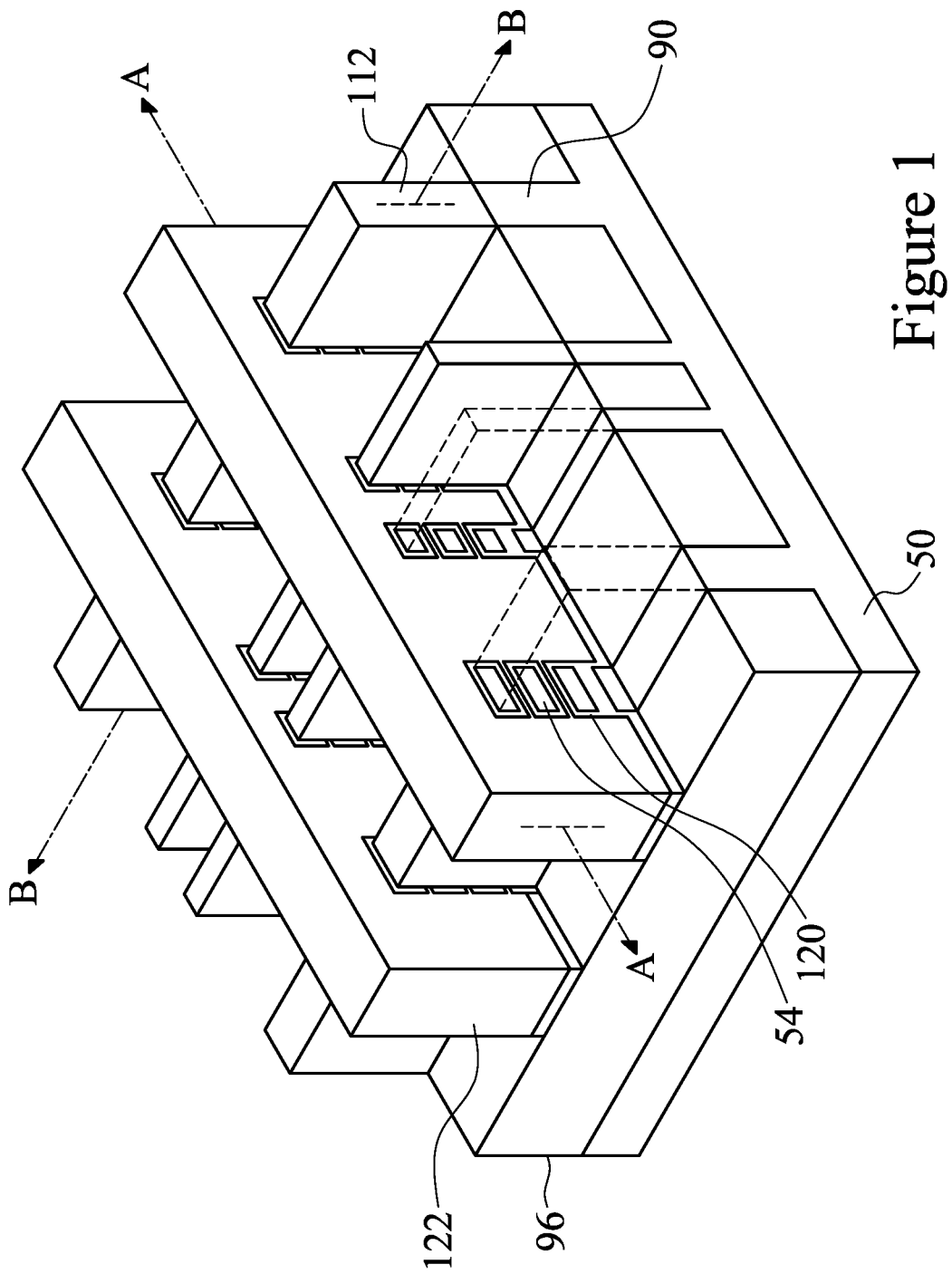
FIG. 1 illustrates an example of a nanosheet field-effect transistor (NSFET) device in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the discussion herein, unless otherwise specified, the same or similar reference numerals in different figures refer to the same or similar component formed by a same or similar process using a same or similar material(s).

In accordance with some embodiments, during formation of a nanosheet field-effect transistor (NSFET) device, dummy inner spacers are formed between the nanosheets, and a material layer (which may be a layer of a semiconductor material or a layer of a dielectric material) is formed over the dummy inner spacers. The dummy inner spacers are subsequently removed during a replacement gate process, and inner spacers are formed to replace the dummy inner spacers. The inner spacers seal air gaps between the inner spacers and the material layer. The air gaps advantageously lower the k-value and reduces the parasitic capacitance of the device formed.

FIG. 1 illustrates an example of a nanosheet field-effect transistor (NSFET) device in a three-dimensional view, in accordance with some embodiments. The NSFET device comprises semiconductor fins 90 (also referred to as fins) protruding above a substrate 50. A gate electrode 122 (e.g., a metal gate) is disposed over the fins, and source/drain regions 112 are formed on opposing sides of the gate electrode 122. A plurality of nanosheets 54 are formed over the fins 90 and between source/drain regions 112. Isolation regions 96 are formed on opposing sides of the fins 90. A gate dielectric layer 120 is formed around the nanosheets 54. Gate electrodes 122 are over and around the gate dielectric layer 120.

FIG. 1 further illustrates reference cross-sections that are used in later figures. Cross-section A-A is along a longitudinal axis of a gate electrode 122 and in a direction, for example, perpendicular to the direction of current flow between the source/drain regions 112 of an NSFET device. Cross-section B-B is perpendicular to cross-section A-A and is along a longitudinal axis of a fin and in a direction of, for example, a current flow between the source/drain regions 112 of the NSFET device. Subsequent figures refer to these reference cross-sections for clarity.

FIGS. 2, 3A, 3B, 4A, 4B, 5A, 5B, and 6-17 are cross-sectional views of a nanosheet field-effect transistor (NSFET) device 100 at various stages of manufacturing, in accordance with an embodiment.

Figure 2:
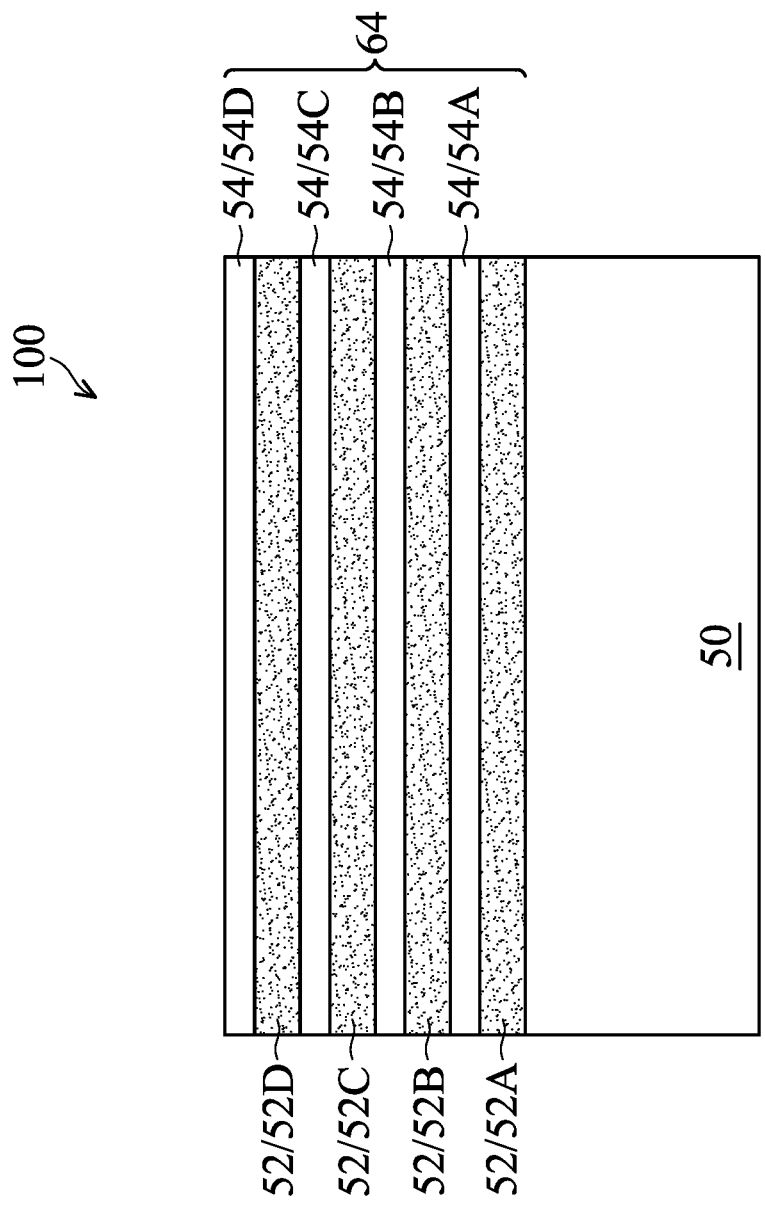

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX)

layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

A multi-layer stack 64 is formed on the substrate 50. The multi-layer stack 64 includes alternating layers of a first semiconductor material 52 and a second semiconductor material 54. In FIG. 2, layers formed by the first semiconductor material 52 are labeled as 52A, 52B, 52C, and 52D, and layers formed by the second semiconductor material 54 are labeled as 54A, 54B, 54C, and 54D. The number of layers formed by the first and the second semiconductor materials illustrated in FIG. 2 are merely non-limiting examples. Other numbers of layers are also possible and are fully intended to be included within the scope of the present disclosure.

In some embodiments, the first semiconductor material 52 is an epitaxial material appropriate for forming channel regions of, e.g., p-type FETs, such as silicon germanium ($Si_xGe_{1-x}$, where x can be in the range of 0 to 1), and the second semiconductor material 54 is an epitaxial material appropriate for forming channel regions of, e.g., n-type FETs, such as silicon. The multi-layer stacks 64 (may also be referred to as an epitaxial material stack) will be patterned to form channel regions of an NSFET in subsequent processing. In particular, the multi-layer stacks 64 will be patterned to form horizontal nanosheets, with the channel regions of the resulting NSFET including multiple horizontal nanosheets.

The multi-layer stacks 64 may be formed by an epitaxial growth process, which may be performed in a growth chamber. During the epitaxial growth process, the growth chamber is cyclically exposed to a first set of precursors for selectively growing the first semiconductor material 52, and then exposed to a second set of precursors for selectively growing the second semiconductor material 54, in some embodiments. The first set of precursors includes precursors for the first semiconductor material (e.g., silicon germanium), and the second set of precursors includes precursors for the second semiconductor material (e.g., silicon). In some embodiments, the first set of precursors includes a silicon precursor (e.g., silane) and a germanium precursor (e.g., a germane), and the second set of precursors includes the silicon precursor but omits the germanium precursor. The epitaxial growth process may thus include continuously enabling a flow of the silicon precursor to the growth chamber, and then cyclically: (1) enabling a flow of the germanium precursor to the growth chamber when growing the first semiconductor material 52; and (2) disabling the flow of the germanium precursor to the growth chamber when growing the second semiconductor material 54. The cyclical exposure may be repeated until a target quantity of layers is formed.

Figure 3B:
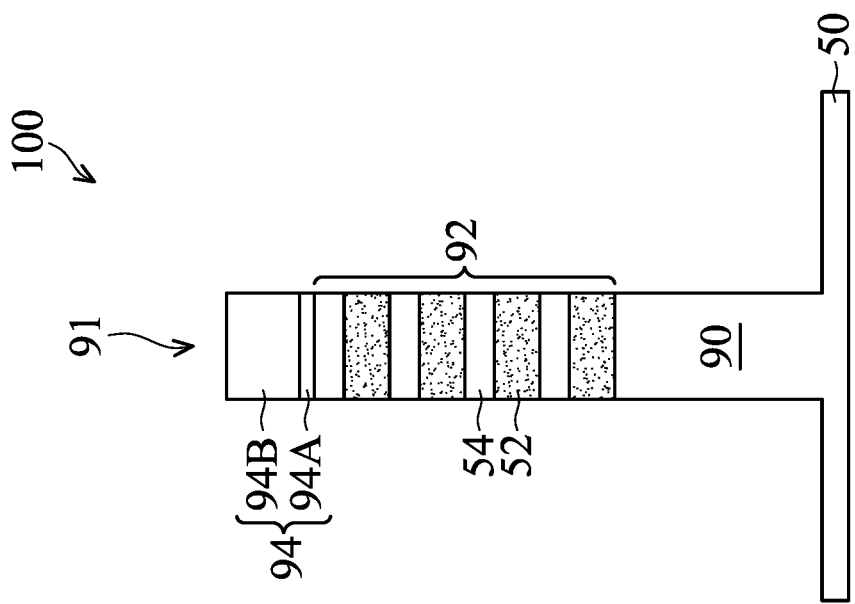

FIGS. 3A, 3B, 4A, 4B, 5A, 5B, and 6-17 are cross-sectional views of the NSFET device 100 at subsequent stages of manufacturing, in accordance with an embodiment. FIGS. 3A, 4A, 5A, and 6-16 are cross-sectional views along cross-section B-B in FIG. 1. FIGS. 3B, 4B, and 5B are cross-sectional views along cross-section A-A in FIG. 1. FIG. 17 is a zoomed-in view of a portion of the NSFET device 100 illustrated in FIG. 16. Although one fin and one gate structure are illustrated in the figures as a non-limiting example, it should be appreciated that other numbers of fins and other numbers of gate structures may also be formed.

Figure 3A:
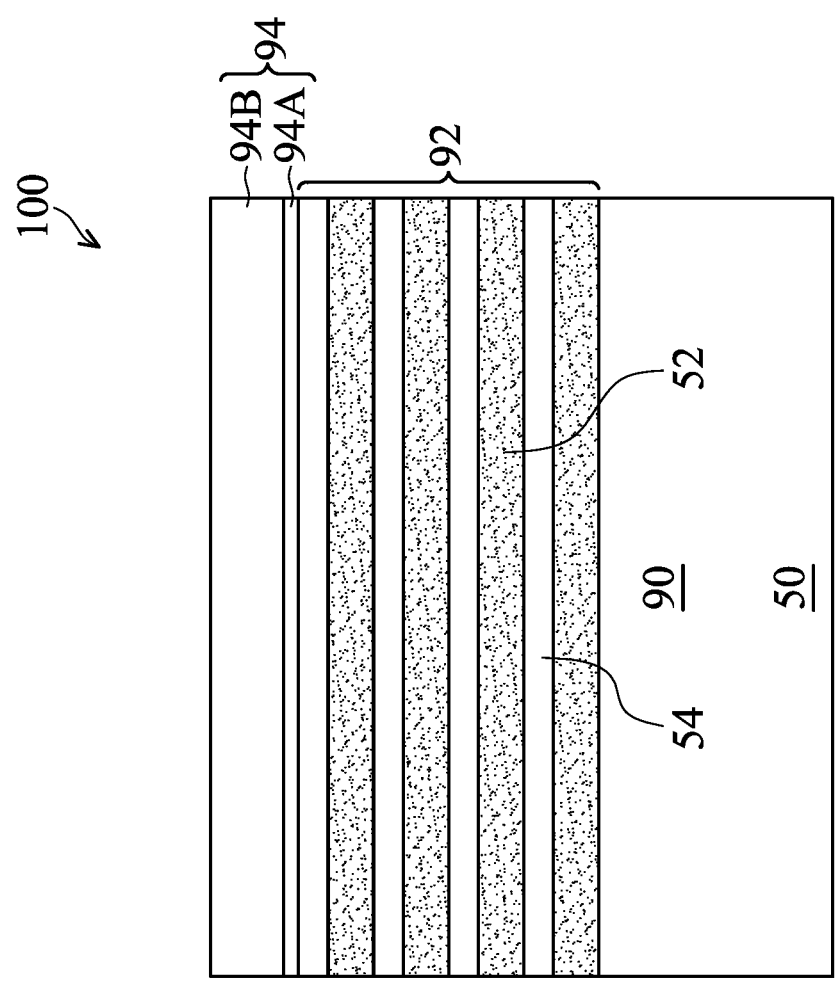
Figure 4B:
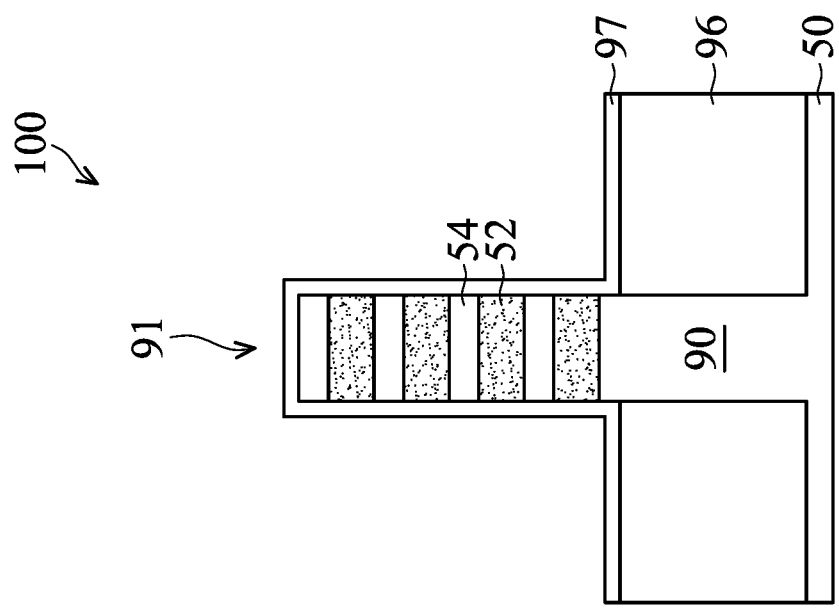

In FIGS. 3A and 3B, a fin structure 91 are formed protruding above the substrate 50. The fin structure 91 includes a semiconductor fin 90 and a nanostructure 92 overlying the semiconductor fin 90. The nanostructure 92 and the semiconductor fin 90 may be formed by etching trenches in the multi-layer stack 64 and the substrate 50, respectively.

The fin structure 91 may be patterned by any suitable method. For example, the fin structure 91 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern, e.g., the fin structure 91.

In some embodiments, the remaining spacers are used to pattern a mask 94, which is then used to pattern the fin structure 91. The mask 94 may be a single layer mask, or may be a multilayer mask such as a multilayer mask that includes a first mask layer 94A and a second mask layer 94B. The first mask layer 94A and second mask layer 94B may each be formed from a dielectric material such as silicon oxide, silicon nitride, a combination thereof, or the like, and may be deposited or thermally grown according to suitable techniques. The first mask layer 94A and second mask layer 94B are different materials having a high etching selectivity. For example, the first mask layer 94A may be silicon oxide, and the second mask layer 94B may be silicon nitride. The mask 94 may be formed by patterning the first mask layer 94A and the second mask layer 94B using any acceptable etching process. The mask 94 may then be used as an etching mask to etch the substrate 50 and the multi-layer stack 64. The etching may be any acceptable etch process, such as a reactive ion etch (RIE), neutral beam etch (NBE), the like, or a combination thereof. The etching is an anisotropic etching process, in some embodiments. After the etching process, the patterned multi-layer stack 64 form the nanostructure 92, and the patterned substrate 50 form the semiconductor fin 90, as illustrated in FIGS. 3A and 3B. Therefore, in the illustrated embodiment, the nanostructure 92 also includes alternating layers of the first semiconductor material 52 and the second semiconductor material 54, and the semiconductor fin 90 is formed of a same material (e.g., silicon) as the substrate 50.

Figure 4A:
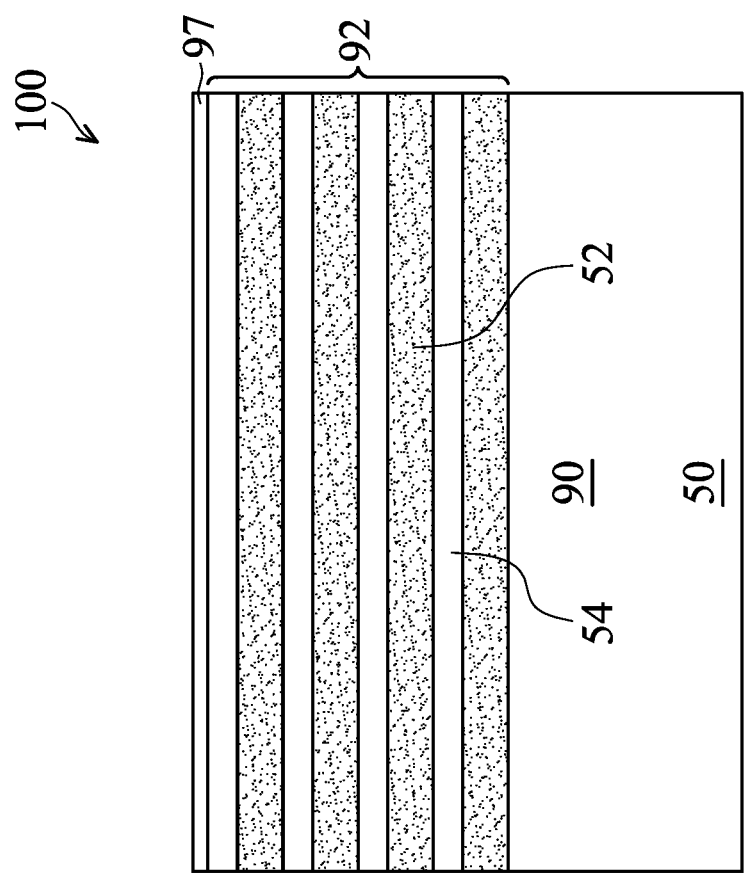
Figure 5B:
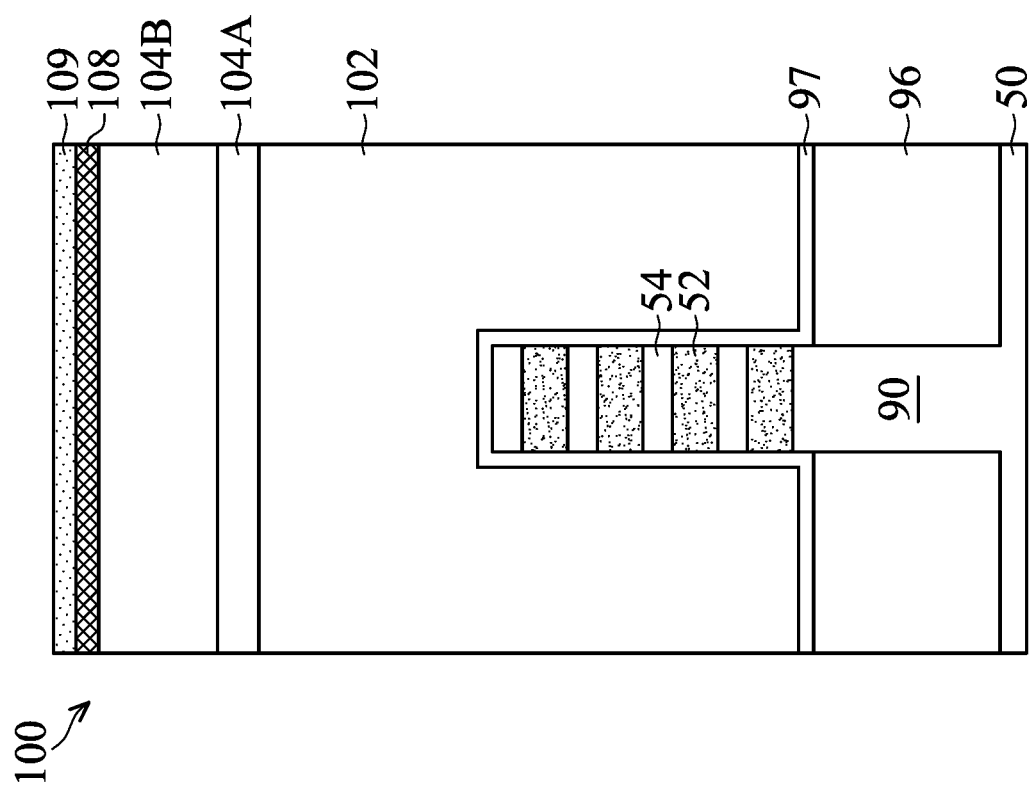

Next, in FIGS. 4A and 4B, Shallow Trench Isolation (STI) regions 96 are formed over the substrate 50 and on opposing sides of the fin structure 91. As an example to form the STI regions 96, an insulation material may be formed over the substrate 50. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed after the insulation material is formed.

In an embodiment, the insulation material is formed such that excess insulation material covers the fin structure 91. In some embodiments, a liner is first formed along surfaces of the substrate 50 and fin structure 91, and a fill material, such as those discussed above is formed over the liner. In some embodiments, the liner is omitted.

Next, a removal process is applied to the insulation material to remove excess insulation material over the fin structure 91. In some embodiments, a planarization process such as a chemical mechanical polish (CMP), an etch back process, combinations thereof, or the like may be utilized. The planarization process exposes the nanostructure 92 such that top surfaces of the nanostructure 92 and the insulation material are level after the planarization process is complete. Next, the insulation material is recessed to form the STI regions 96. The insulation material is recessed such that the nanostructure 92 protrudes from between neighboring STI regions 96. Top portions of the semiconductor fin 90 may also protrude from between neighboring STI regions 96. Further, the top surfaces of the STI regions 96 may have a flat surface as illustrated, a convex surface, a concave surface (such as dishing), or a combination thereof. The top surfaces of the STI regions 96 may be formed flat, convex, and/or concave by an appropriate etch. The STI regions 96 may be recessed using an acceptable etching process, such as one that is selective to the material of the insulation material (e.g., etches the material of the insulation material at a faster rate than the material of the semiconductor fins 90 and the nanostructures 92). For example, a chemical oxide removal with a suitable etchant such as dilute hydrofluoric (dHF) acid may be used.

Still referring to FIGS. 4A and 4B, a dummy dielectric layer 97 is formed over the nanostructure 92 and over the STI region 96. The dummy dielectric layer 97 may be, for example, silicon oxide, silicon nitride, a combination thereof, or the like, and may be deposited or thermally grown according to acceptable techniques. In an embodiment, a layer of silicon is conformally formed over the nanostructure 92 and over the upper surface of the STI regions 96, and a thermal oxidation process is performed to convert the deposited silicon layer into an oxide layer as the dummy dielectric layer 97.

Figure 5A:
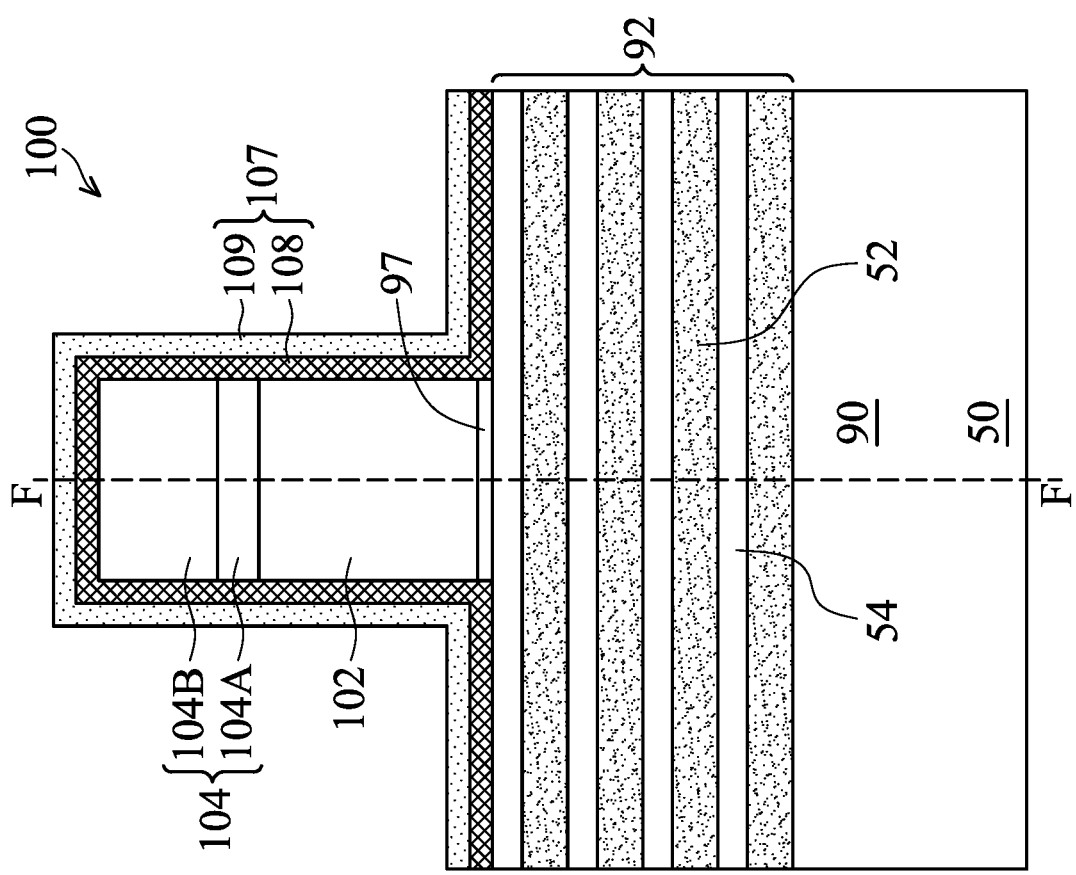

Next, in FIGS. 5A and 5B, a dummy gate 102 are formed over the fin 90 and over the nanostructure 92. To form the dummy gate 102, a dummy gate layer may be formed over the dummy dielectric layer 97. The dummy gate layer may be deposited over the dummy dielectric layer 97 and then planarized, such as by a CMP. The dummy gate layer may be a conductive material and may be selected from a group including amorphous silicon, polycrystalline-silicon (polysilicon), poly-crystalline silicon-germanium (poly-SiGe), or the like. The dummy gate layer may be deposited by physical vapor deposition (PVD), CVD, sputter deposition, or other techniques known and used in the art. The dummy gate layer may be made of other materials that have a high etching selectivity from the isolation regions 96.

Masks 104 are then formed over the dummy gate layer. The masks 104 may be formed from silicon nitride, silicon oxynitride, combinations thereof, or the like, and may be patterned using acceptable photolithography and etching techniques. In the illustrated embodiment, the mask 104 includes a first mask layer 104A (e.g., a silicon oxide layer) and a second mask layer 104B (e.g., a silicon nitride layer). The pattern of the masks 104 is then transferred to the dummy gate layer by an acceptable etching technique to form the dummy gate 102, and then transferred to the dummy dielectric layer by acceptable etching technique to form dummy gate dielectrics 97. The dummy gate 102 cover respective channel regions of the nanostructures 92. The pattern of the masks 104 may be used to physically separate the dummy gate 102 from adjacent dummy gates. The dummy gate 102 may also have a lengthwise direction substantially perpendicular to the lengthwise direction of the fins 90. The dummy gate 102 and the dummy gate dielectric 97 are collectively referred to as dummy gate structure, in some embodiments.

Next, a gate spacer layer 107 is formed by conformally depositing an insulating material over the nanostructure 92, the STI regions 96, and the dummy gate 102. The insulating material may be silicon nitride, silicon carbonitride, a combination thereof, or the like. In some embodiments, the gate spacer layer 107 includes multiple sublayers. For example, a first sublayer 108 (sometimes referred to as a gate seal spacer layer) may be formed by thermal oxidation or a deposition, and a second sublayer 109 (sometimes referred to as a main gate spacer layer) may be conformally deposited on the first sublayer 108.

FIG. 5B illustrates cross-sectional views of the NSFET device 100 in FIG. 5A, but along cross-section F-F in FIG. 5A. The cross-section F-F in FIG. 5A corresponds to the cross-section A-A in FIG. 1.

Next, in FIG. 6, the gate spacer layer 107 is etched by an anisotropic etching process to form gate spacers 107. The anisotropic etching process may remove horizontal portions of the gate spacer layer 107 (e.g., portions over the STI regions 96 and the dummy gate 102), with remaining vertical portions of the gate spacer layer 107 (e.g., along sidewalls of the dummy gate 102 and the dummy gate dielectric 97) forming the gate spacers 107.

After the formation of the gate spacers 107, implantation for lightly doped source/drain (LDD) regions (not shown) may be performed. Appropriate type (e.g., p-type or n-type) impurities may be implanted into the exposed nanostructure 92 and/or the semiconductor fin 90. The n-type impurities may be the any suitable n-type impurities, such as phosphorus, arsenic, antimony, or the like, and the p-type impurities may be the any suitable p-type impurities, such as boron, $BF_2$, indium, or the like. The lightly doped source/drain regions may have a concentration of impurities of from about $10^{15}$ cm$^{-3}$ to about $10^{16}$ cm$^{-3}$. An anneal process may be used to activate the implanted impurities.

Next, in FIG. 7, openings 110 (may also be referred to as recesses) are formed in the nanostructure 92. The openings 110 may extend through the nanostructure 92 and into the semiconductor fin 90. The openings 110 may be formed by any acceptable etching technique, using, e.g., the dummy gate 102 as an etching mask. The openings 110 exposes end portions of the first semiconductor material 52 and end portions of the second semiconductor material 54.

Figure 8:
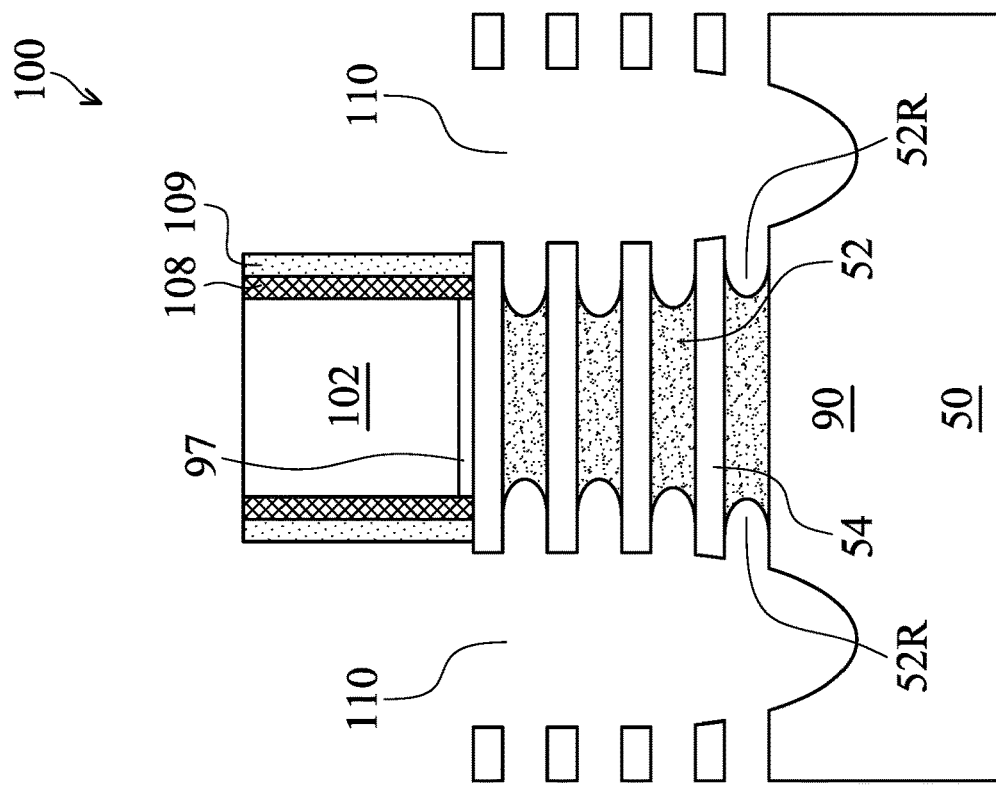

Next, in FIG. 8, after the openings 110 are formed, a selective etching process (e.g., a wet etch process using an etching chemical) is performed to recess end portions of the first semiconductor material 52 exposed by the openings 110 without substantially attacking the second semiconductor material 54. After the selective etching process, recesses 52R are formed in the first semiconductor material 52 at locations where the removed end portions used to be.

Figure 9:
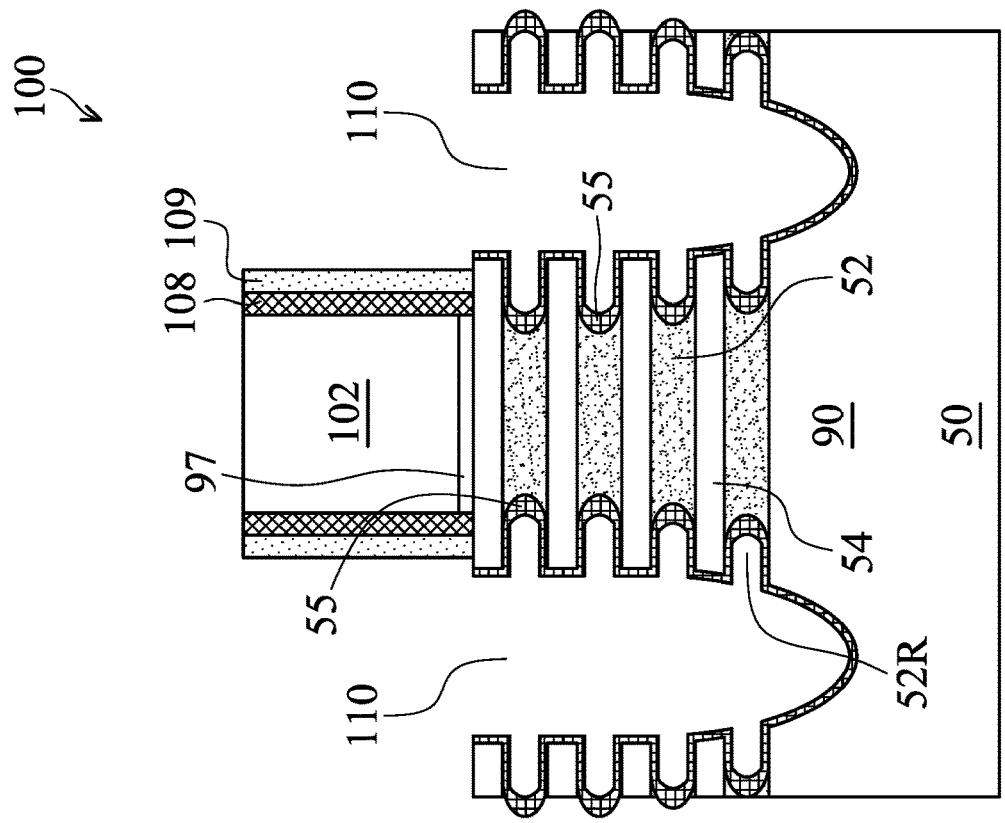

Next, in FIG. 9, a dummy inner spacer layer 55 is formed (e.g., conformally) in the openings 110. The dummy inner spacer layer 55 lines sidewalls and bottoms of the openings 110. The dummy inner spacer layer 55 also lines surfaces of the recesses 52R. In the illustrated embodiment, a thickness of the dummy inner spacer layer 55 in the recesses 52R is larger than a thickness of the dummy inner spacer layer 55 disposed outside the recesses 52R (e.g., along sidewalls of the openings 110). The larger thickness of the dummy inner spacer layer 55 in the recesses 52R may be caused by a faster deposition/accumulation rate of the deposited material at small/narrow spaces (e.g., inside the recesses 52R).

In some embodiments, the dummy inner spacer layer 55 is formed of a suitable dielectric material, such as silicon oxide, and may be formed by a suitable deposition method such as ALD, PVD, CVD, or the like. The material of the dummy inner spacer layer 55 may be chosen to have a same or similar etch rate as the first semiconductor material 52, such that in a subsequent etching process to remove the first semiconductor material 52, dummy inner spacers 55 (formed by etching the dummy inner spacer layer 55) and the first semiconductor material 52 may be removed by a same etching process.

Figure 10:
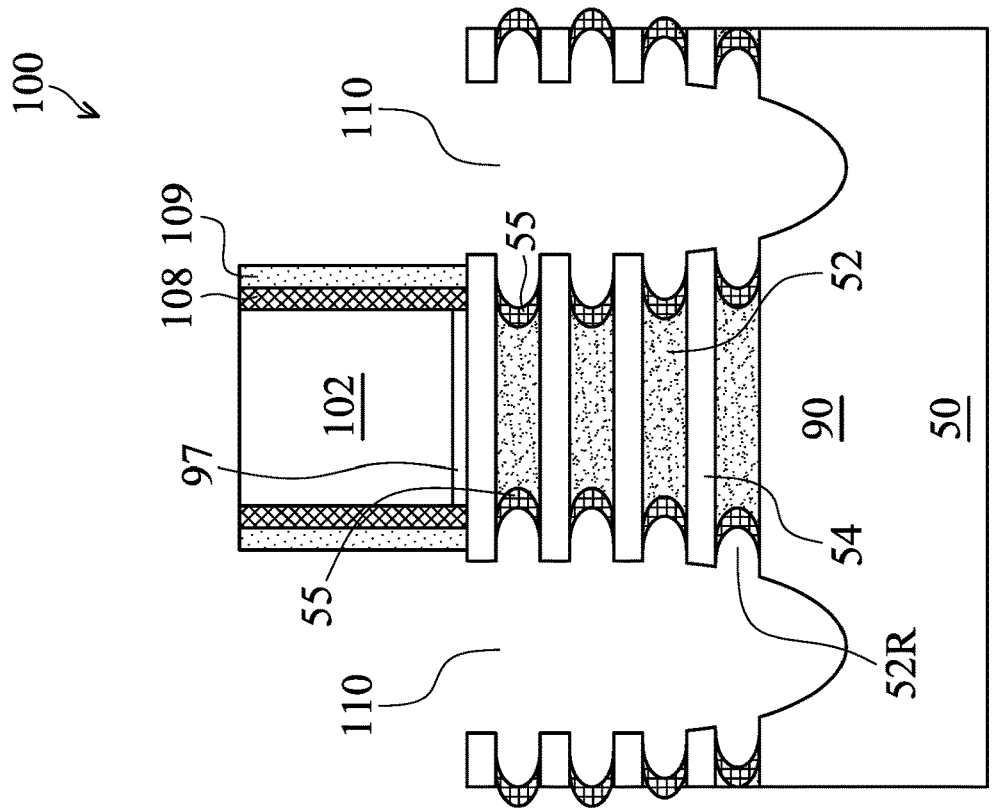

Next, in FIG. 10, an etching process is performed to remove portions of the dummy inner spacer layer 55 disposed outside the recesses 52R. The remaining portions of the dummy inner spacer layer 55 (e.g., portions disposed inside the recesses 52R) form dummy inner spacers 55. In an embodiment, the etching process is a wet etch process using a suitable etchant such as dilute hydrofluoric (dHF) acid. The wet etch process may be a timed process, such that the dummy inner spacer layer 55 disposed outside the recesses 52R are removed while portions of the (thicker) dummy inner spacer layer 55 inside the recesses 52R remain to form the dummy inner spacers 55.

Figure 11:
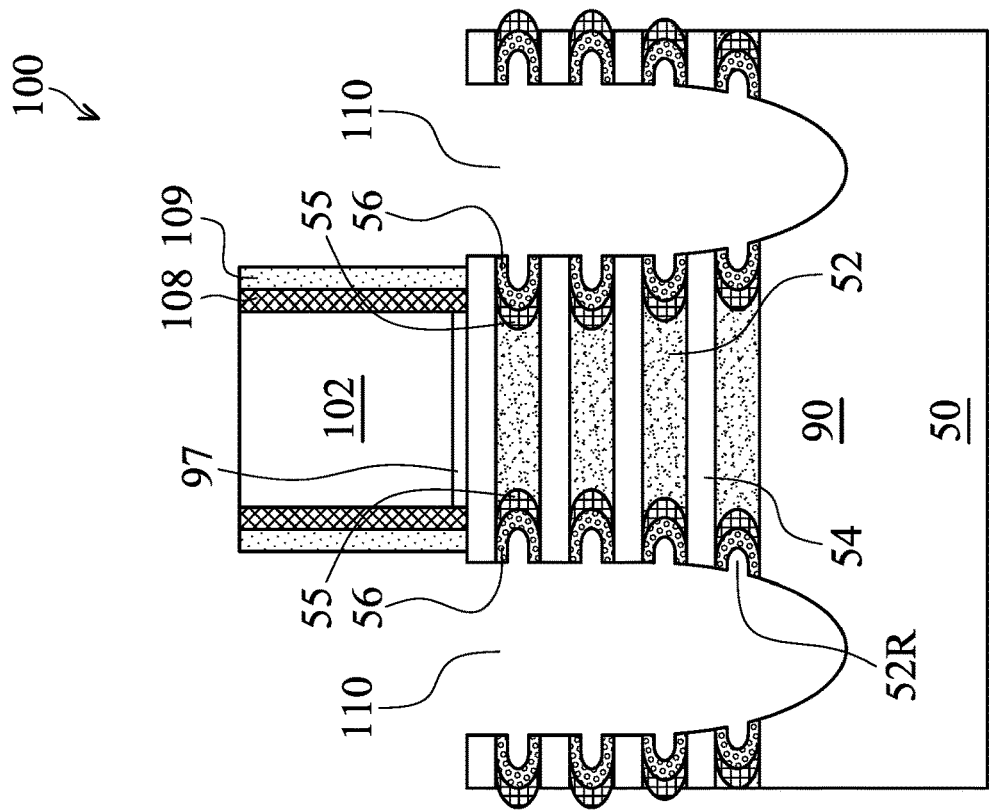

Next, in FIG. 11, a material layer 56 is formed in the recesses 52R over the dummy inner spacers 55. In the example of FIG. 11, the material layer 56 is a semiconductor material, such as silicon, formed by a suitable formation method, such as an epitaxy process. In the illustrated embodiment, the material layer 56 and the second semiconductor material 54 are formed of a same material (e.g., silicon), although the material layer 56 may be formed of a different material from the second semiconductor material 54.

In an embodiment, to form the material layer 56, a layer of epitaxial silicon is formed conformally in the openings 110 and in the recesses 52R. An etching process (e.g., an anisotropic etching process) is then performed to remove portions of the epitaxial silicon layer disposed outside the recesses 52R, and portions of the (thicker) epitaxial silicon layer inside the recesses 52R remain to form the material layer 56. As illustrated in FIG. 11, the material layer 56 comprises multiple segments, where each segment is disposed over (e.g., contacting) a respective dummy inner spacer 55. Using a semiconductor material (e.g., silicon) as the material layer 56 is conducive to the formation of source/drain regions 112 in a subsequent process. In the example of FIG. 11, the material layer 56 and the dummy inner spacers 55 do not completely fill the recesses 52R, and as a result, the subsequently formed source/drain regions 112 have a plurality of protrusions (see 112P in FIG. 12) that extend into (e.g., fill) the remaining spaces of the recesses 52R.

Figure 12:
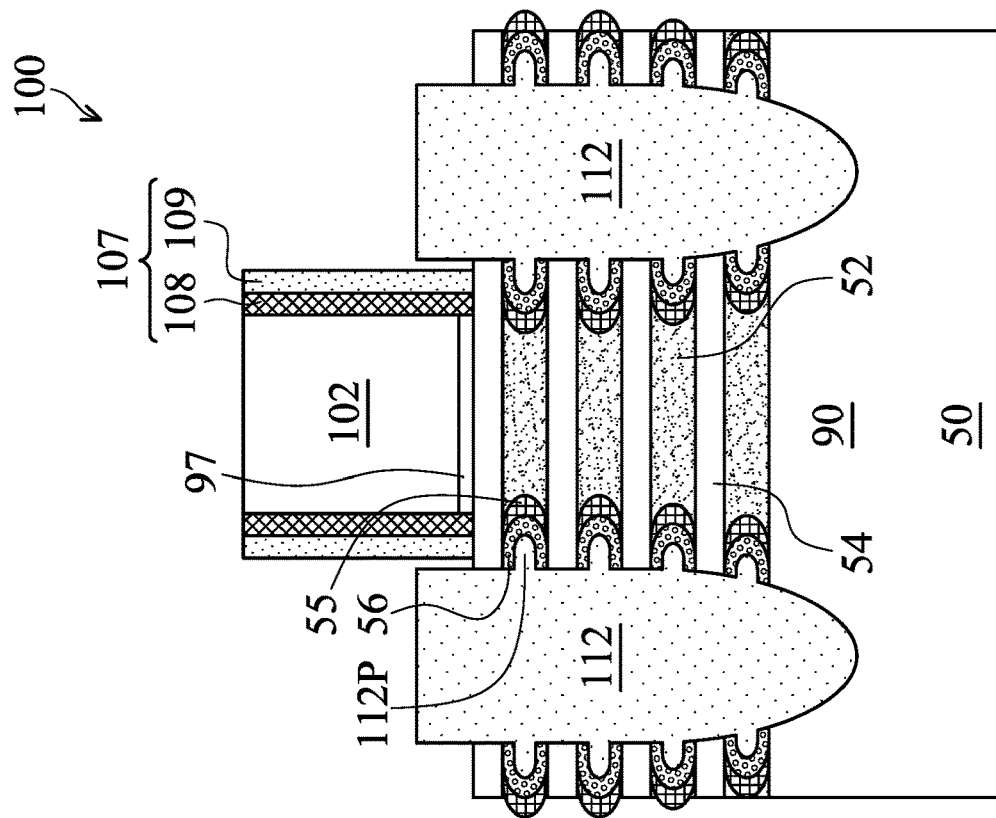

Next, in FIG. 12, source/drain regions 112 are formed in the openings 110. As illustrated in FIG. 12, the source/drain regions 112 fill the openings 110, and have a plurality of protrusions 112P that fill the recesses 52R in the first semiconductor material 52. In the illustrated embodiment, the source/drain regions 112 are formed of an epitaxial material(s), and therefore, may also be referred to as epitaxial source/drain regions 112. In some embodiments, the epitaxial source/drain regions 112 are formed in the openings 110 to exert stress in the respective channel regions of the NSFET device formed, thereby improving performance. The epitaxial source/drain regions 112 are formed such that the dummy gate 102 is disposed between neighboring pairs of the epitaxial source/drain regions 112. In some embodiments, the gate spacers 107 are used to separate the epitaxial source/drain regions 112 from the dummy gate 102 by an appropriate lateral distance so that the epitaxial source/drain regions 112 do not short out subsequently formed gate of the resulting NSFET device.

The epitaxial source/drain regions 112 are epitaxially grown in the openings 110. The epitaxial source/drain regions 112 may include any acceptable material, such as appropriate for n-type or p-type device. For example, when n-type devices are formed, the epitaxial source/drain regions 112 may include materials exerting a tensile strain in the channel regions, such as silicon, SiC, SiCP, SiP, or the like. Likewise, when p-type devices are formed, the epitaxial source/drain regions 112 may include materials exerting a compressive strain in the channel regions, such as SiGe, SiGeB, Ge, GeSn, or the like. The epitaxial source/drain regions 112 may have surfaces raised from respective surfaces of the fins and may have facets.

The epitaxial source/drain regions 112 and/or the fins may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 112 may be in situ doped during growth.

As a result of the epitaxy processes used to form the epitaxial source/drain regions 112, upper surfaces of the epitaxial source/drain regions 112 have facets which expand laterally outward beyond sidewalls of the fin 90. In some embodiments, adjacent epitaxial source/drain regions 112 disposed over adjacent fins remain separated after the epitaxy process is completed. In other embodiments, these facets cause adjacent epitaxial source/drain regions 112 disposed over adjacent fins of a same NSFET to merge.

Figure 13:
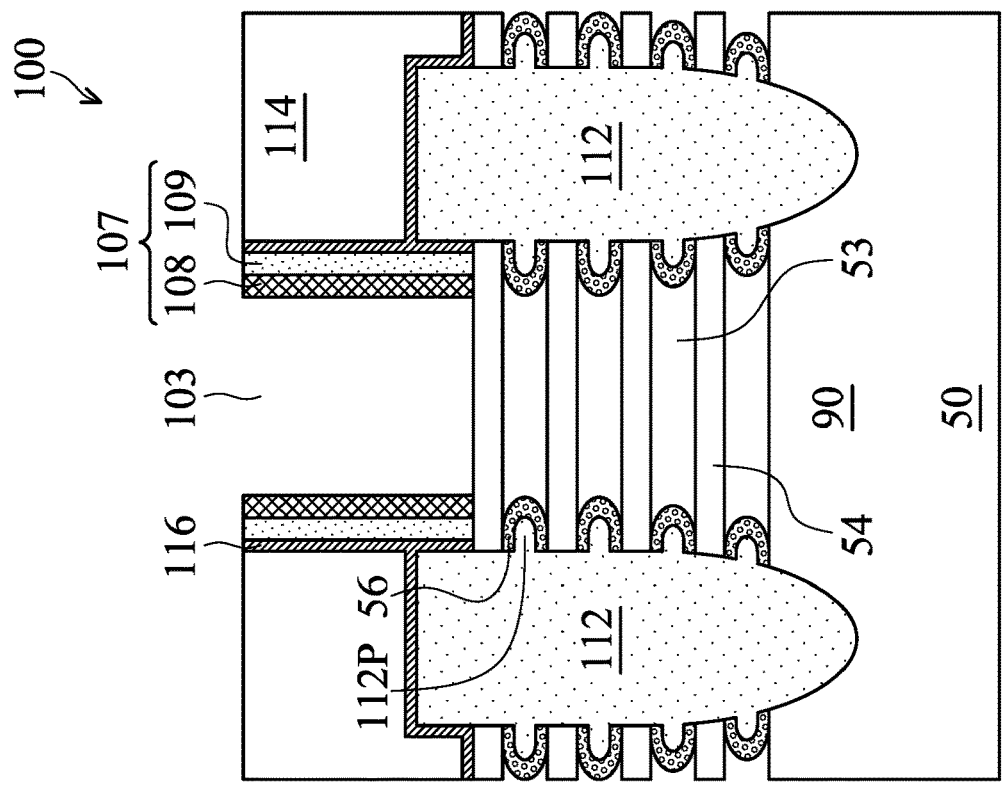

Next, in FIG. 13, a contact etch stop layer (CESL) 116 is formed (e.g., conformally) over the source/drain regions 112 and over the dummy gate 102, and a first inter-layer dielectric (ILD) 114 is then deposited over the CESL 116. The CESL 116 is formed of a material having a different etch rate than the first ILD 114, and may be formed of silicon nitride using PECVD, although other dielectric materials such as silicon oxide, silicon oxynitride, combinations thereof, or the like, and alternative techniques of forming the CESL 116, such as low pressure CVD (LPCVD), PVD, or the like, could alternatively be used.

The first ILD 114 may be formed of a dielectric material, and may be deposited by any suitable method, such as CVD, plasma-enhanced CVD (PECVD), or FCVD. Dielectric materials for the first ILD 114 may include silicon oxide, Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used.

Next, the dummy gate 102 is removed. To remove the dummy gate 102, a planarization process, such as a CMP, is performed to level the top surfaces of the first ILD 114 and CESL 116 with the top surfaces of the dummy gate 102 and gate spacers 107. The planarization process may also remove the masks 104 (see FIG. 5A) on the dummy gates 102 (if the mask 104 has not been removed by the anisotropic etching process to form the gate spacers 107), and portions of the gate spacers 107 along sidewalls of the masks 104. After the planarization process, top surfaces of the dummy gate 102, gate spacers 107, and first ILD 114 are level. Accordingly, the top surfaces of the dummy gate 102 are exposed through the first ILD 114.

After the planarization process, the dummy gate 102 is removed in an etching step(s), so that a recess 103 is formed between the gate spacers 107. In some embodiments, the dummy gate 102 is removed by an anisotropic dry etch process. For example, the etching process may include a dry etch process using reaction gas(es) that selectively etch the dummy gate 102 without etching the first ILD 114 or the gate spacers 107. The recess 103 exposes the channel regions of the NSFET. The channel regions are disposed between neighboring pairs of the epitaxial source/drain regions 112. During the removal of the dummy gate 102, the dummy gate dielectric 97 may be used as an etch stop layer when the dummy gate 102 is etched. The dummy gate dielectric 97 may then be removed after the removal of the dummy gate 102. After removal of the dummy gate 102, the first semiconductor material 52 and the second semiconductor material 54 that were disposed under the dummy gate 102 are exposed by the recess 103.

Next, the first semiconductor material 52 is removed to release the second semiconductor material 54. After the first semiconductor material 52 is removed, the second semiconductor material 54 forms a plurality of nanosheets 54 that extend horizontally (e.g., parallel to a major upper surface of the substrate 50). The nanosheets 54 may be collectively referred to as the channel regions or the channel layers of the NSFET device 100 formed. As illustrated in FIG. 13, gaps 53 (e.g., empty spaces) are formed between the nanosheets 54 by the removal of the first semiconductor material 52. The nanosheets 54 may also be referred to as nanowires, and the NSFET device 100 may also be referred to as a gate-all-around (GAA) device, in some embodiments.

In some embodiments, the first semiconductor material 52 is removed by a selective etching process using an etchant that is selective to (e.g., having a higher etch rate for) the first semiconductor material 52, such that the first semiconductor material 52 is removed without substantially attacking the second semiconductor material 54. In an embodiment, an isotropic etching process is performed to remove the first semiconductor material 52. The isotropic etching process may be performed using an etching gas, and optionally, a carrier gas, where the etching gas comprises $F_2$ and HF, and the carrier gas may be an inert gas such as Ar, He, $N_2$, combinations thereof, or the like.

In some embodiments, the dummy inner spacers 55 are also removed by the etching process to remove the first semiconductor material 52. In other embodiments, after the first semiconductor material 52 is removed, an additional etching process is performed to remove (e.g., selectively remove) the dummy inner spacers 55. After the dummy inner spacers 55 are removed, the material layer 56 (e.g., silicon) is exposed in the gaps 53.

Figure 14:
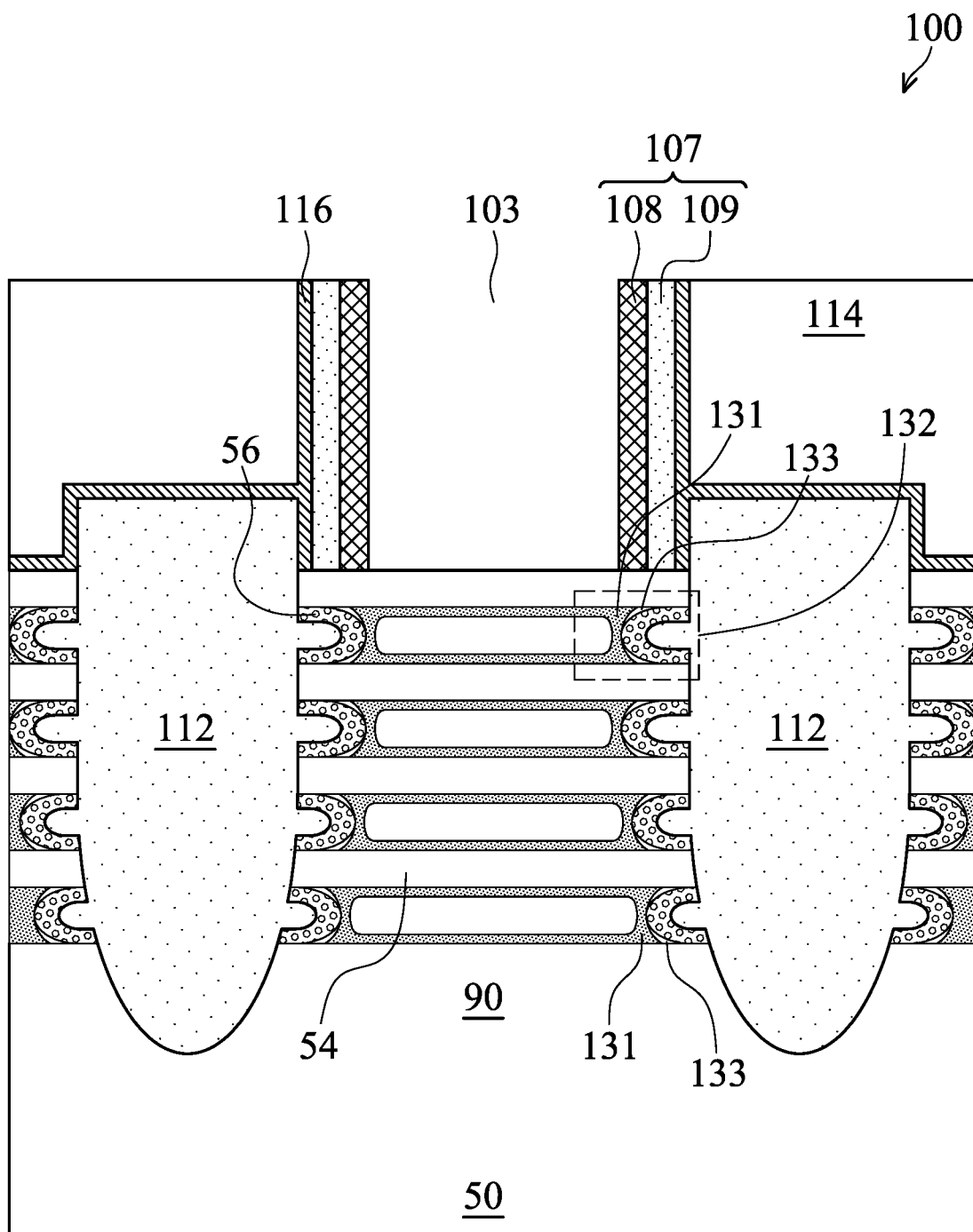

Next, in FIG. 14, an inner spacer layer 131 is formed (e.g., conformally) in the recess 103 and around the nanosheets 54. In some embodiments, the inner spacer layer 131 is formed of a suitable dielectric material. Examples for the material of the inner spacer layer 131 include silicon nitride (SiN), silicon oxynitride (SiON), silicon carbon nitride (SiCN), silicon oxycarbonitride (SiOCN), silicon carbide (SiC), silicon oxide ($SiO_2$), or the like, formed by a suitable deposition method such as ALD, PVD, CVD, or the like.

As illustrated in FIG. 14, in an area 132 proximate to the end portion of the nanosheet 54, due to the protrusion 112P of the source/drain regions 112 and the material layer 56 over the protrusion 112P, a small space (see label 133) is formed. The small space makes it easier to be sealed by the inner spacer layer 131 to form an air gap 133. A zoomed-in view of the area 132 is illustrated in FIG. 17. Details of the air gap 133 are discussed hereinafter. In some embodiments, due to the faster deposition/accumulation rate at small/narrow spaces, portions of the inner spacer layer 131 in the area 132 (e.g., portions contacting the material layer 56) has a larger thickness than other portions of the inner spacer layer.

Figure 15:
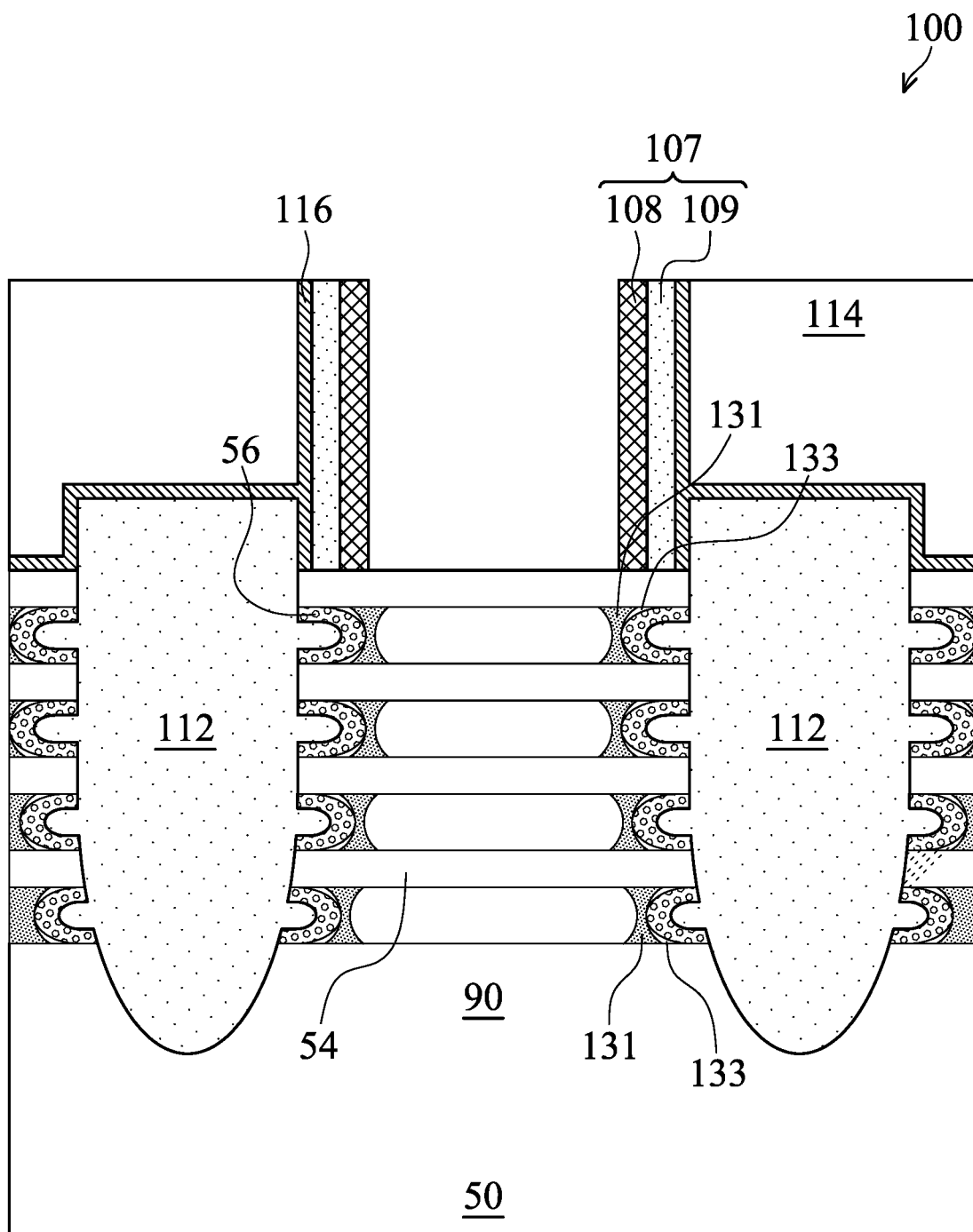

Next, in FIG. 15, an etching process is performed to remove portions of the inner spacer layer 131. The etching process may be a wet etch process performed using a suitable etchant such as $H_3PO_4$. The etching process may be a timed process, such that portions of the inner spacer layer 131 outside the area 132 (e.g., around the middle portions of the nanosheets 54) are completely removed, while remaining portions of the inner spacer layer 131 inside the area 132 (e.g., portions contacting the material layer 56 and sealing the air gaps 133) form inner spacers 131. As illustrated in FIG. 15, each of the inner spacers 131 extends continuously between two adjacent nanosheets 54 or between a lowermost nanosheet 54 and the fin 90, and seals an air gap 133.

Figure 16:
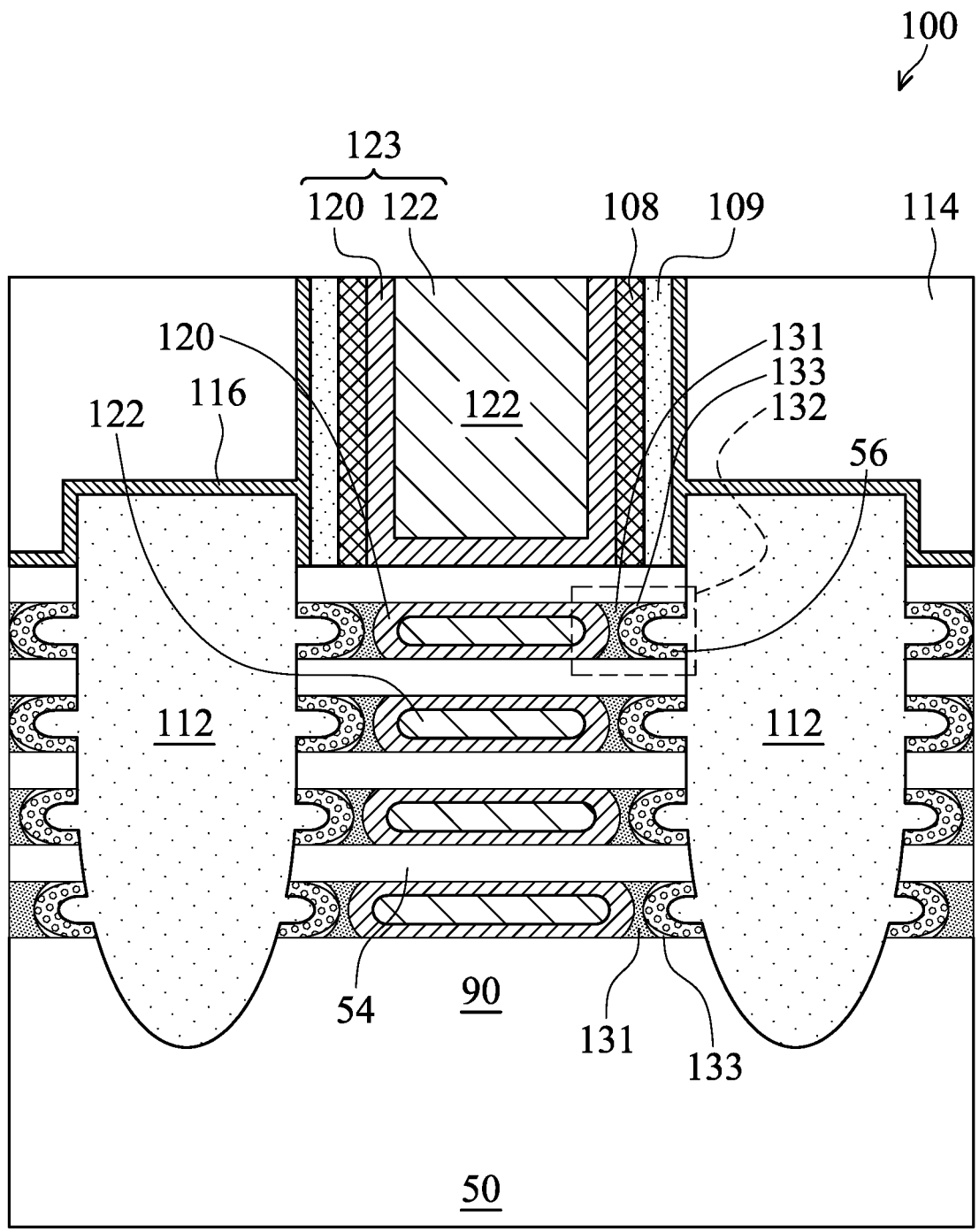
Figure 17:
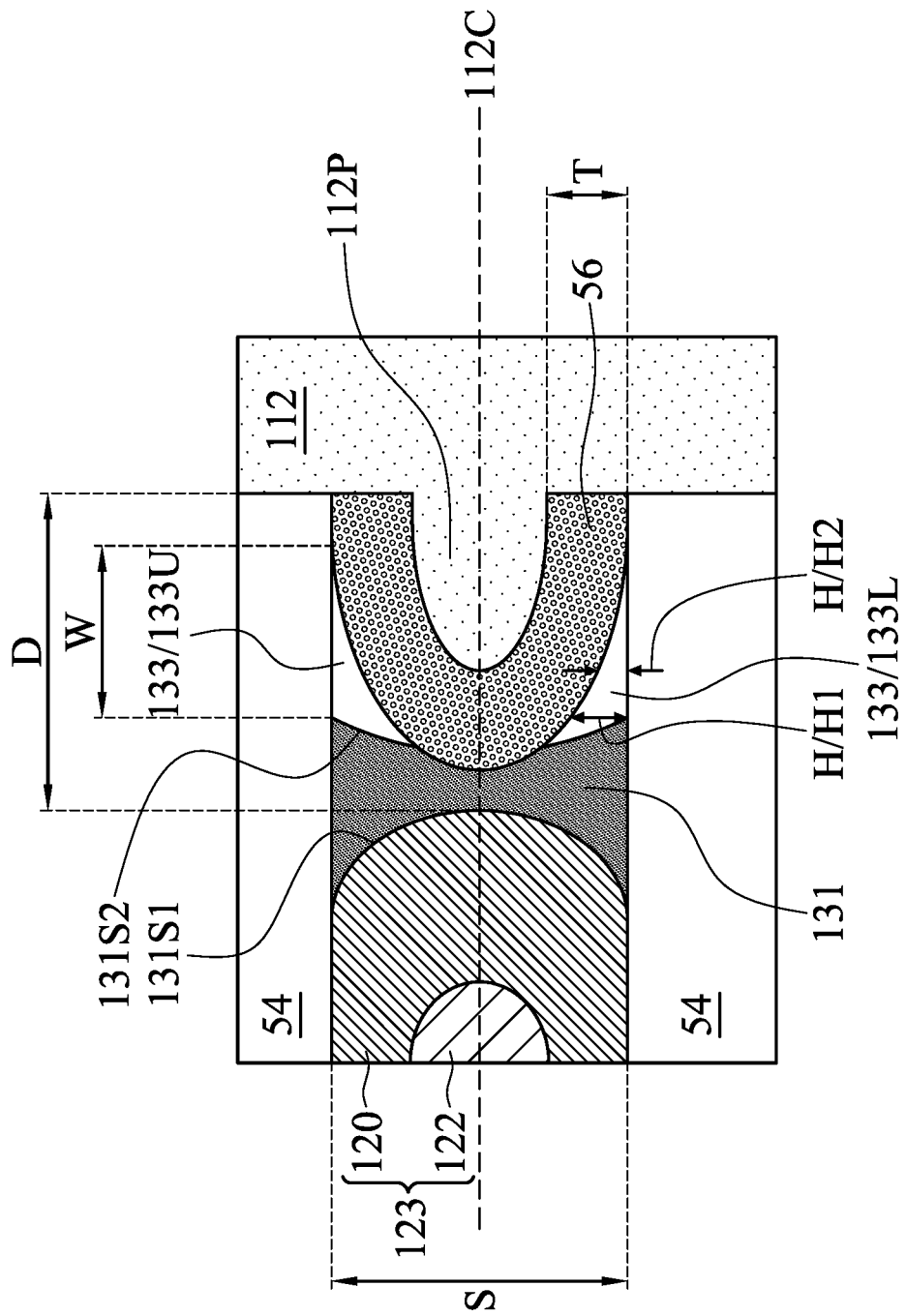

Next, in FIG. 16, a gate dielectric layer 120 is formed (e.g., conformally) in the recess 103. The gate dielectric layer 120 wraps around the nanosheets 54, lines sidewalls of the first sublayer 108 of the gate spacers, and extends along the upper surface and sidewalls of the fin 90. In accordance with some embodiments, the gate dielectric layer 120 comprises silicon oxide, silicon nitride, or multilayers thereof. In some embodiments, the gate dielectric layer 120 includes a high-k dielectric material, and in these embodiments, the gate dielectric layer 120 may have a k value greater than about 7.0, and may include a metal oxide or a silicate of Hf, Al, Zr, La, Mg, Ba, Ti, or Pb, or combinations thereof. The formation methods of the gate dielectric layer 120 may include Molecular-Beam Deposition (MBD), ALD, PECVD, and the like.

Next, a gate electrode material (e.g., an electrically conductive material) is formed in the recess 103 to form the gate electrode 122. The gate electrode 122 fills the remaining portions of the recess 103 The gate electrode 122 may be made of a metal-containing material such as Cu, Al, W, the like, combinations thereof, or multi-layers thereof, and may be formed by, e.g., electroplating, electroless plating, or other suitable method. After the filling of the gate electrodes 122, a planarization process, such as a CMP, may be performed to remove the excess portions of the gate dielectric layer 120 and the material of the gate electrodes 122, which excess portions are over the top surface of the first ILD 114. The remaining portions of material of the gate electrode 122 and the gate dielectric layer 120 thus form replacement gate of the resulting NSFET device 100. The gate electrode 122 and the corresponding gate dielectric layer 120 may be collectively referred to as a gate stack 123, a replacement gate structure 123, or a metal gate structure 123. Each gate stack 123 extends over and around the respective nanosheets 54.

Although the gate electrode 122 is illustrated as a single layer in the example of FIG. 16, one skilled in the art will readily appreciate that the gate electrode 122 may have a multi-layered structure and may include a plurality layers, such as a barrier layer, a work function layer, a seed layer and a fill metal.

For example, a barrier layer may be formed conformally over the gate dielectric layer 120. The barrier layer may comprise an electrically conductive material such as titanium nitride, although other materials, such as tantalum nitride, titanium, tantalum, or the like, may alternatively be utilized. A work function layer may be formed over the barrier layer. Exemplary p-type work function materials (may also be referred to as p-type work function metals) include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function materials (may also be referred to as n-type work function metals) include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the work function layer is chosen to tune its work function value so that a target threshold voltage $V_{TH}$ is achieved in the device that is to be formed.

FIG. 17 is a zoomed-in view of the area 132 in FIG. 16. As illustrated in FIG. 17, the inner spacer 131 seals an air gap 133 disposed between the inner spacer 131 and the material layer 56, and between two adjacent nanosheets 54. The air gap 133 may include an upper portion 133U over the protrusion 112P of the source/drain regions 112, and a lower portion 133L below the protrusion 112P. In some embodiments, the upper portion 133U and the lower portions 133L of the air gap 133 are two separate sealed spaces. In some embodiments, the upper portion 133U and the lower portion 133L have similar shapes (e.g., are substantially mirror symmetric about a horizontal center axis 112C of the protrusion 112P in FIG. 17). In the example of FIG. 17, the upper portion 133U (or the lower portion 133L) of the air gap 133 has a width W between the inner spacer 131 and the material layer 56, where the width W increases continuously along a vertical direction of FIG. 17 from the center of two adjacent nanosheets 54 toward one of the two adjacent nanosheets 54. In addition, the upper portion 133U (or the lower portion 133L) of the air gap 133 has a height H, which includes a first value H1 measured between the inner spacer 131 and the material layer 56, and has a second value H2 measured between the nanosheet 54 and the material layer 56, where H1 increases continuously along a horizontal direction of FIG. 17 from the left to the right, and H2 decreases continuously along the horizontal direction of FIG. 17 from the left to the right. In FIG. 17, the inner spacer 131 has a surface 131S1 facing and contacting the gate stack 123, and has a surface 131S2 facing the air gap 133. The material layer 56 may extend into the surface 131S2, as illustrated in FIG. 17. The surfaces 131S1 and 131S2 are curved surfaces. When looking along a first direction from the inner spacer 131 toward the gate stack 123, the surface 131S1 is a concave surface, and the surface 131S2 is a convex surface; when looking along a second direction opposite to the first direction, the surface 131S1 is a convex surface, and the surface 131S2 is a concave surface. In some embodiments, a distance S between adjacent nanosheets 54 is between about 5 nm and about 20 nm, a distance D between the source/drain region 112 and the surface 131S1 of the inner spacer layer 131 is between about 5 nm and about 15 nm, and a thickness T of the material layer 56 is between about 2 nm and about 7 nm. In some embodiments, the height H of the air gap 133 (e.g., 133U or 133L) is between about a quarter of the distance S and about half of the distance S (e.g., 0.25 S<H≤0.5 S). In some embodiments, the width W of the air gap 133 is between about D-T and about D-0.5 T (e.g., D-T≤W<D-0.5 T).

In some embodiments, the air gap 133 reduces the k value (e.g., the average k value) of the dielectric materials proximate to the gate stack 123, thereby improving the device performance by reducing the parasitic capacitance of the NSFET device 100.

Additional processing may be performed to finish fabrication of the NSFET device 100, as one of ordinary skill readily appreciates, thus details may not be repeated here. For example, a second ILD may be deposited over the first ILD 114. Further, gate contacts and source/drain contacts may be formed through the second ILD and/or the first ILD 114 to electrically couple to the gate electrode 122 and the source/drain regions 112, respectively.

Figure 18:
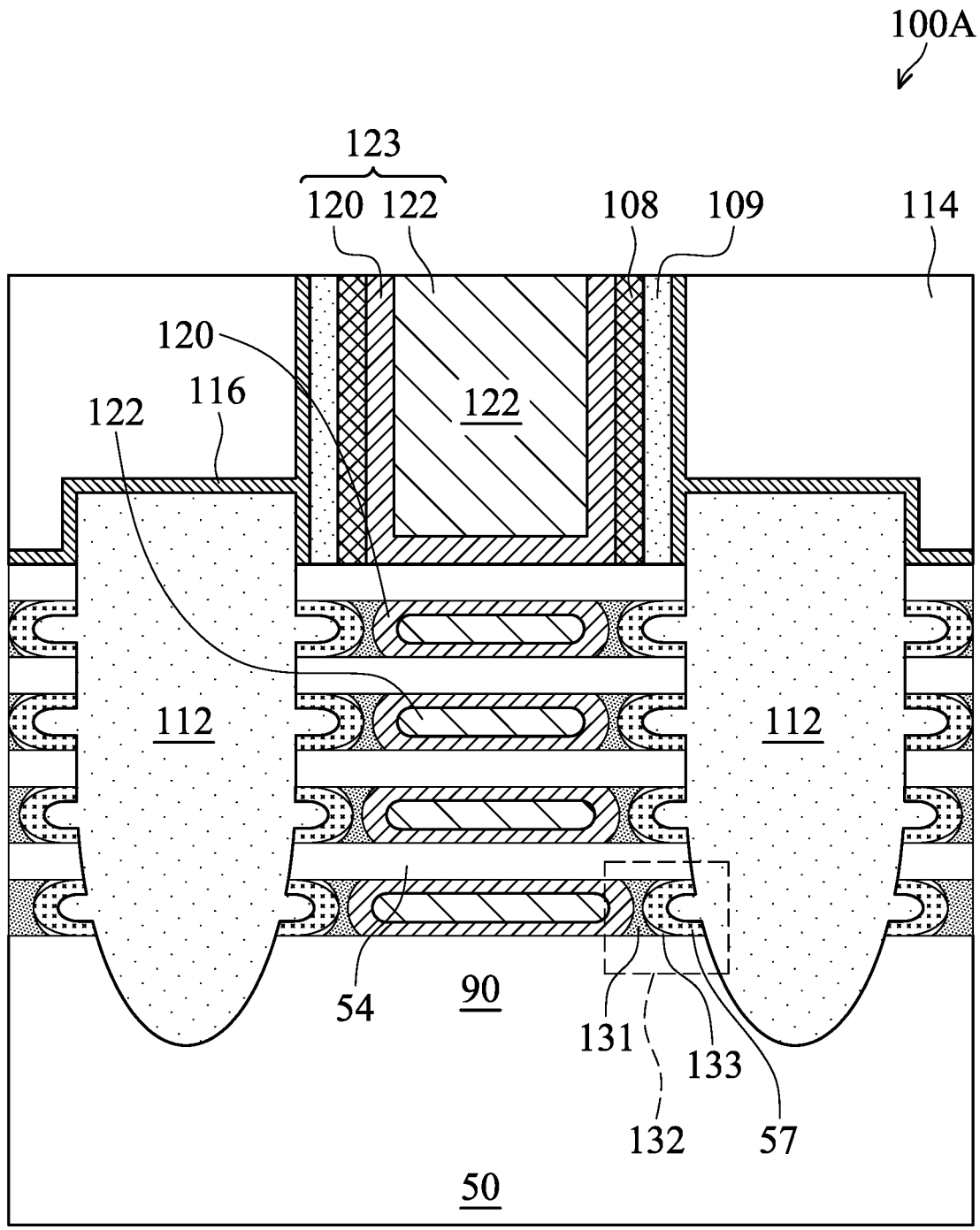
FIGS. 18 and 19 are cross-sectional views of a nanosheet field-effect transistor device at a certain stage of manufacturing, in accordance with another embodiment.

FIG. 18 is a cross-sectional view of a nanosheet field-effect transistor device 100A at a certain stage of manufacturing, in accordance with another embodiment. The NSFET device 100A is similar to the NSFET device 100 of FIG. 16, but the material layer of FIG. 16 (e.g., a semiconductor layer) is replaced with a material layer 57, which is a layer of dielectric material. The material layer 57 may be formed using a same or similar processing (e.g., a deposition process followed by an etching process) as discussed above with reference to FIG. 11 for the material layer 56. After the material layer 57 is formed, the same or similar processing as illustrated in FIGS. 12-16 may be performed to form the nanosheet field-effect transistor device 100A of FIG. 18. In some embodiments, the material of the material layer 57 is the same as the material of the inner spacers 131, such as silicon nitride. In other embodiments, the material of the material layer 57 is a dielectric material different from the dielectric material of the inner spacers 131.

Figure 19:
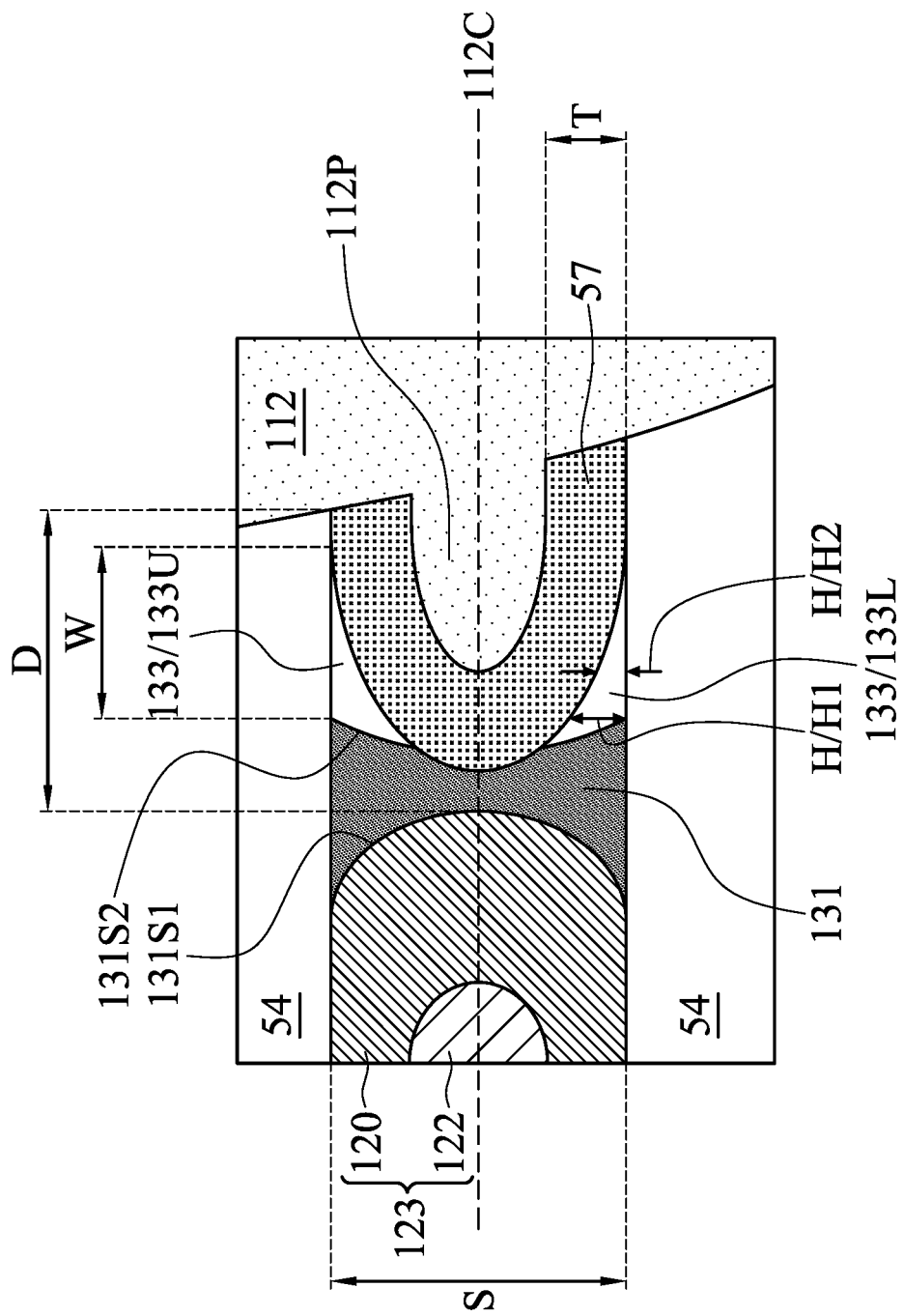

FIG. 19 is a zoomed-in view of the area 132 in FIG. 18. As illustrated in FIG. 19, the inner spacers 131 seals an air gap 133 disposed between the material layer 57 and the inner spacer 131, and between two adjacent nanosheets 54. Details of the air gap 133, such as the shapes and dimensions, are the same as or similar to those of FIG. 17, thus are not repeated here.

Variations of the disclosed embodiments are possible and are fully intended to be included within the scope of the present disclosure. For example, depending on the type of device (e.g., n-type or p-type device) formed, the second semiconductor material 54 may be removed, and the first semiconductor material 52 may remain to form the nanosheets to function as the channel regions of the NSFET device formed. In embodiments where the first semiconductor material 52 remain to form the nanosheets, inner spacers are formed proximate to the end portions of the second semiconductor material 54, as one of ordinary skill readily appreciates.

Embodiments may achieve advantages. The disclosed method or structure reduces the parasitic capacitance of the NSFET device by forming air gaps between the inner spacers and the source/drain regions 112. In addition, epitaxial growth of the source/drain regions 112 are facilitated by using a semiconductor material (e.g., silicon) as the material layer 56.

Figure 20:
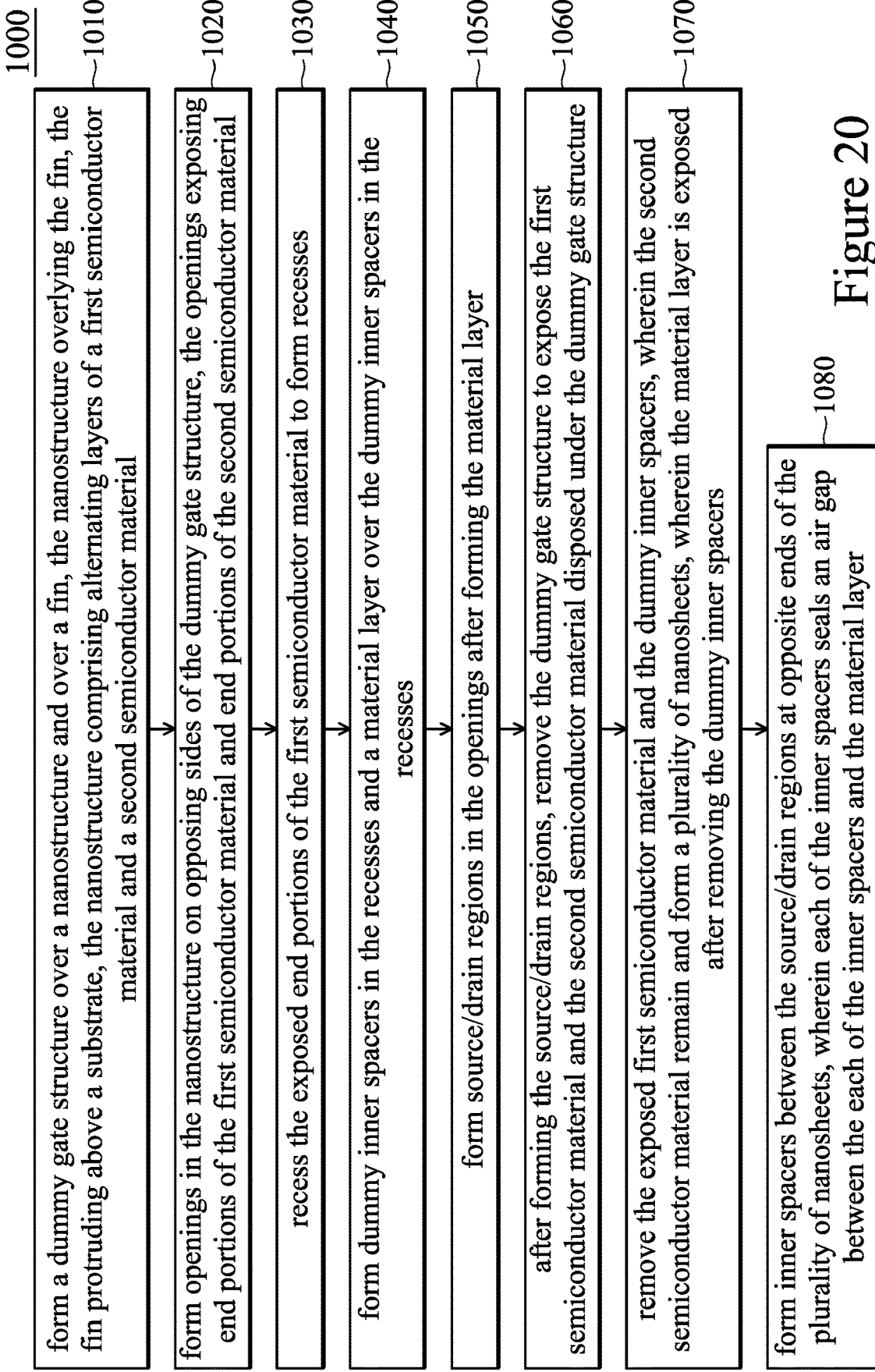
FIG. 20 is a flow chart of a method of forming a semiconductor device, in some embodiments.

FIG. 20 illustrates a flow chart of a method of fabricating a semiconductor device, in accordance with some embodiments. It should be understood that the embodiment method shown in FIG. 20 is merely an example of many possible embodiment methods. One of ordinary skill in the art would recognize many variations, alternatives, and modifications.

For example, various steps as illustrated in FIG. 20 may be added, removed, replaced, rearranged, or repeated.

Referring to FIG. 20, at step 1010, a dummy gate structure is formed over a nanostructure and over a fin, the nanostructure overlying the fin, the fin protruding above a substrate, the nanostructure comprising alternating layers of a first semiconductor material and a second semiconductor material. At step 1020, openings are formed in the nanostructure on opposing sides of the dummy gate structure, the openings exposing end portions of the first semiconductor material and end portions of the second semiconductor material. At step 1030, the exposed end portions of the first semiconductor material are recessed to form recesses. At step 1040, dummy inner spacers are formed in the recesses and a material layer is formed over the dummy inner spacers in the recesses. As step 1050, source/drain regions are formed in the openings after forming the material layer. At step 1060, after forming the source/drain regions, the dummy gate structure is removed to expose the first semiconductor material and the second semiconductor material disposed under the dummy gate structure. At step 1070, the exposed first semiconductor material and the dummy inner spacers are removed, wherein the second semiconductor material remain and form a plurality of nanosheets, wherein the material layer is exposed after removing the dummy inner spacers. At step 1080, inner spacers are formed between the source/drain regions at opposite ends of the plurality of nanosheets, wherein each of the inner spacers seals an air gap between the each of the inner spacers and the material layer.

In an embodiment, a semiconductor device includes: a fin protruding above a substrate; source/drain regions over the fin; nanosheets between the source/drain regions, where the nanosheets comprise a first semiconductor material; inner spacers between the nanosheets and at opposite ends of the nanosheets, where there is an air gap between each of the inner spacers and a respective source/drain region of the source/drain regions; and a gate structure over the fin and between the source/drain regions. In an embodiment, the nanosheets are parallel to each other and are parallel to a major upper surface of the substrate. In an embodiment, the semiconductor device further includes a material layer between each of the inner spacers and the respective source/drain region, where the air gap is between each of the inner spacers and the material layer. In an embodiment, the material layer is a layer of a second semiconductor material. In an embodiment, the first semiconductor material is a same as the second semiconductor material. In an embodiment, the source/drain regions have a plurality of protrusions extending between the nanosheets toward the inner spacers, where the material layer extends conformally over the plurality of protrusions. In an embodiment, the material layer is a layer of a first dielectric material, and the inner spacers comprise a second dielectric material. In an embodiment, the first dielectric material is a same as the second dielectric material. In an embodiment, the air gap is sealed in a space between each of the inner spacers and the respective source/drain region, and between adjacent ones of the nanosheets. In an embodiment, each of the inner spacers has a concave surface facing the gate structure.

In an embodiment, a semiconductor device includes: a fin protruding above a substrate; a gate structure over the fin; source/drain regions over the fin on opposing sides of the gate structure; a first channel layer and a second channel layer disposed between the source/drain regions and parallel to each other, where the gate structure wraps around the first channel layer and the second channel layer; and inner spacers disposed between end portions of the first channel layer and end portions of the second channel layer, where there are air gaps between the inner spacers and the source/drain regions. In an embodiment, the semiconductor device further includes a material layer between the inner spacers and the source/drain regions, where the air gaps are between the inner spacers and the material layer. In an embodiment, the material layer is semiconductor layer. In an embodiment, the material layer is a dielectric layer. In an embodiment, the inner spacers and the material layer comprise a same dielectric material. In an embodiment, each of the inner spacers has a first concave surface facing the gate structure, and has a second concave surface facing the source/drain regions.

In an embodiment, a method of forming a semiconductor device includes: forming a dummy gate structure over a nanostructure and over a fin, the nanostructure overlying the fin, the fin protruding above a substrate, the nanostructure comprising alternating layers of a first semiconductor material and a second semiconductor material; forming openings in the nanostructure on opposing sides of the dummy gate structure, the openings exposing end portions of the first semiconductor material and end portions of the second semiconductor material; recessing the exposed end portions of the first semiconductor material to form recesses; forming dummy inner spacers in the recesses and a material layer over the dummy inner spacers in the recesses; forming source/drain regions in the openings after forming the material layer; after forming the source/drain regions, removing the dummy gate structure to expose the first semiconductor material and the second semiconductor material disposed under the dummy gate structure; removing the exposed first semiconductor material and the dummy inner spacers, where the second semiconductor material remain and form a plurality of nanosheets, where the material layer is exposed after removing the dummy inner spacers; and forming inner spacers between the source/drain regions at opposite ends of the plurality of nanosheets, where each of the inner spacers seals an air gap between the each of the inner spacers and the material layer. In an embodiment, the method further includes after forming the inner spacers, forming a replacement gate structure that wraps around the plurality of nanosheets. In an embodiment, forming the material layer comprises forming the material layer using a semiconductor material. In an embodiment, forming the material layer comprises forming the material layer using a dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a fin protruding above a substrate;
source/drain regions over the fin;
nanosheets between the source/drain regions;
inner spacers between end portions of the nanosheets;
a material layer between the inner spacers and the source/drain regions;

air gaps between the inner spaces and the material layer, wherein each air gap is disposed laterally between an inner spacer and the material layer, wherein each air gap comprises an upper portion and a lower portion that is separated from the upper portion; and a gate structure over the fin and between the source/drain regions.

2. The semiconductor device of claim 1, wherein the source/drain regions have a plurality of protrusions that extend into spaces between the nanosheets, wherein the material layer contacts the plurality of protrusions.

3. The semiconductor device of claim 2, wherein the material layer has a curved surface facing each of the plurality of protrusions of the source/drain regions, wherein each of the plurality of protrusions contacts and extends along a respective curved surface of the material layer.

4. The semiconductor device of claim 1, wherein the material layer contacts a middle portion of the inner spacer and is spaced apart from end portions of the inner spacer, wherein the middle portion of the inner spacer is disposed halfway between adjacent nanosheets or between a lowermost nanosheet and the fin, wherein the end portions of the inner spacer are portions of the inner spacer distal from the middle portion of the inner spacer.

5. The semiconductor device of claim 1, wherein a width of the upper portion of each air gap, measured between the inner spacer and the material layer, increases as the upper portion of each air gap extends along a first direction from a center location between two adjacent nanosheets toward a first one of the two adjacent nanosheets, wherein the first one of the two adjacent nanosheets extends further from the substrate than a second one of the two adjacent nanosheets.

6. The semiconductor device of claim 5, wherein a height of the upper portion of each air gap has a first value measured between the inner spacer and the material layer, and has a second value measured between the material layer and the first one of the two adjacent nanosheets, wherein the first value increases along a second direction from the inner spacer toward the material layer, and the second value decreases along the second direction.

7. The semiconductor device of claim 1, wherein each of the inner spacers has a first curved surface facing the material layer, and has a second curved surface facing the gate structure.

8. The semiconductor device of claim 7, wherein the first curved surface and the second curved surface are concave surfaces.

9. The semiconductor device of claim 1, wherein the material layer is a semiconductor material.

10. The semiconductor device of claim 1, wherein the material layer is a dielectric material.

11. A semiconductor device comprising:
a fin protruding above a substrate;
a gate structure over the fin;
source/drain regions over the fin on opposite sides of the gate structure;
a first channel layer and a second channel layer disposed between the source/drain regions and parallel to each other, wherein the gate structure wraps around the first channel layer and the second channel layer; and
inner spacers disposed between end portions of the first channel layer and end portions of the second channel layer, wherein each of the inner spacers has a first curved surface facing the gate structure, and has a second curved surface facing the source/drain regions, wherein a thickness of a first inner spacer of the inner spacers, measured between the first curved surface and the second curved surface of the first inner spacer, has a smallest value at a center location between the first channel layer and the second channel layer, and has a largest value at an interface between the first inner spacer and the first channel layer.

12. The semiconductor device of claim 11, further comprising air gaps between the inner spacers and the source/drain regions.

13. The semiconductor device of claim 12, further comprising a material layer between the inner spacers and the source/drain regions, wherein the air gaps are between the inner spacers and the material layer.

14. The semiconductor device of claim 13, wherein the material layer has a third curved surface that contacts the second curved surface of each of the inner spacers, and has a fourth curved surface that faces a respective source/drain region.

15. The semiconductor device of claim 14, wherein the respective source/drain region contacts and extends along the fourth curved surface of the material layer.

16. The semiconductor device of claim 13, wherein the material layer is a semiconductor material.

17. The semiconductor device of claim 11, wherein the thickness of the first inner spacer increases continuously from the center location between the first channel layer and the second channel layer toward the interface between the first inner spacer and the first channel layer.

18. A method of forming a semiconductor device, the method comprising:
forming a dummy gate structure over a nanostructure, wherein the nanostructure overlies a fin that protrudes above a substrate, the nanostructure comprising alternating layers of a first semiconductor material and a second semiconductor material;
forming openings in the nanostructure on opposing sides of the dummy gate structure;
recessing end portions of the first semiconductor material exposed by the openings to form recesses;
forming dummy inner spacers in the recesses;
forming a material layer in the recess on the dummy inner spacers;
forming source/drain regions in the openings after forming the material layer;
after forming the source/drain regions, removing the dummy gate structure to expose the first semiconductor material and the second semiconductor material disposed under the dummy gate structure;
performing an etching process to remove the exposed first semiconductor material and the dummy inner spacers, wherein the second semiconductor material under the dummy gate structure remains to form a plurality of nanosheets; and
after performing the etching process, forming inner spacers between end portions of adjacent ones of the plurality of nanosheets.

19. The method of claim 18, wherein forming the inner spacers comprises:
after the etching process, forming an inner spacer layer to line surfaces of the nanosheets and to line surfaces of the material layer exposed by the removal of the dummy inner spacers; and
performing another etching process to remove first portions of the inner spacer layer, wherein second portions of the inner spacer layer contacting the material layer remain to form the inner spacers.

20. The method of claim 19, wherein after the another etching process, air gaps are sealed between the inner spacers and the material layer.

* * * * *